(12) United States Patent
Hirohama et al.

(10) Patent No.: US 7,169,682 B2
(45) Date of Patent: Jan. 30, 2007

(54) METHOD FOR MANUFACTURING SEMICONDUCTOR DEVICE

(75) Inventors: Kazuhiro Hirohama, Fukuyama (JP); Masaru Tanaka, Fukuyama (JP); Takayoshi Hashimoto, Fukuyama (JP); Shinichi Sato, Fukuyama (JP); Hideyuki Kanzawa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 86 days.

(21) Appl. No.: 11/041,981

(22) Filed: Jan. 26, 2005

(65) Prior Publication Data

US 2005/0170607 A1    Aug. 4, 2005

(30) Foreign Application Priority Data

Jan. 29, 2004   (JP)   ............................. 2004-021974
Oct. 13, 2004   (JP)   ............................. 2004-298865

(51) Int. Cl.
*H01L 21/76* (2006.01)
*H01L 21/4763* (2006.01)

(52) U.S. Cl. ............................. 438/424; 257/E21.252; 257/E21.301; 257/E21.637; 257/E21.606; 257/E21.6; 438/640

(58) Field of Classification Search ................ 438/424, 438/640
See application file for complete search history.

(56) References Cited

U.S. PATENT DOCUMENTS

| 6,017,796 | A  | * | 1/2000  | Chen et al. | ................. | 438/264 |
| 6,197,687 | B1 | * | 3/2001  | Buynoski    | ................. | 438/671 |
| 6,605,852 | B2 | * | 8/2003  | Mori et al. | ................. | 257/459 |
| 6,730,992 | B2 | * | 5/2004  | Sakama et al. | ............. | 257/639 |
| 6,803,661 | B2 | * | 10/2004 | Thakar et al. | ............. | 257/758 |
| 6,848,454 | B2 | * | 2/2005  | Hirohama et al. | ........... | 134/1.1 |
| 7,001,839 | B2 | * | 2/2006  | Fukuzumi    | ................. | 438/640 |
| 7,071,517 | B2 | * | 7/2006  | Kim et al.  | ................. | 257/382 |
| 2002/0146906 | A1 | * | 10/2002 | Brase et al. | ............. | 438/689 |

FOREIGN PATENT DOCUMENTS

| JP | 04-196315   | 7/1992  |
| JP | 10-056021   | 2/1998  |
| JP | 2000-164701 | 6/2000  |
| JP | 2000-235969 | 8/2000  |
| JP | 2000-269192 | 9/2000  |
| JP | 2001-93970  | 4/2001  |
| JP | 2001-176841 | 6/2001  |
| JP | 2002-353195 | 12/2002 |
| JP | 2003-511857 | 3/2003  |

* cited by examiner

*Primary Examiner*—Walter Lindsay, Jr.
*Assistant Examiner*—Thu-Huong Dinh
(74) *Attorney, Agent, or Firm*—Nixon & Vanderhye P.C.

(57) ABSTRACT

A method for manufacturing a semiconductor device comprising: a first step of successively forming a silicon oxide film and a silicon nitride film on a silicon substrate, followed by forming a silicon nitride oxide film or a multilayered film containing the silicon nitride oxide film on the silicon nitride film; a second step of forming a photoresist film having an opening portion located at the position corresponding to an element isolation area of the silicon substrate on the silicon nitride film or the multilayered film according to a photolithography method; a third step of forming a trench having a pair of tapered side surface portions on the confronting side surfaces thereof on the silicon nitride oxide film or the multilayered film by using the photoresist film as a mask, the tapered side surface portions being inclined toward the substrate side so as to approach each other; and a fourth step of patterning the silicon nitride film and the silicon oxide film by dry etching by using the photoresist film and the silicon nitride oxide film or the multilayered film as a mask.

17 Claims, 17 Drawing Sheets

METHOD FOR MANUFACTURING SEMICONDUCTOR DEVICE

CROSS-REFERENCE TO RELATED APPLICATION

This application is related to Japanese applications Nos. 2004-021974 and 2004-298865, filed on 29 Jan., 2004 and 13 Oct., 2004 whose priorities are claimed under 35 USC § 119, the disclosures of which are incorporated by reference in their entirety.

BACKGROUND OF THE INVENTION

1. Field of the Invention

The present invention relates to a method for manufacturing a semiconductor device, and particularly to a substrate processing method for forming a shallow trench isolation on a silicon substrate.

2. Description of the Related Art

A LOCOS (Local Oxidation Of Silicon) method is generally used for isolating elements in a semiconductor device. However, the LOCOS method has not been applicable to miniaturization of recent ULSI because corrosion of oxide film (bird's beak) occurs in an element formed area in the LOCOS method and thus the element formed area per unit area is reduced. Therefore, much attention has been recently paid to a shallow trench isolation method for forming a trench in a silicon substrate and then embedding the insulating film in the trench to isolate elements.

A prior art 1 of the shallow trench isolation process will be described with reference to FIG. 7(a) to FIG. 7(f).

As shown in FIG. 7(a), a silicon oxide film 202 of about 10 nm in thickness is formed on the overall surface of a silicon substrate 201, and subsequently a silicon nitride film 203 of about 160 nm in thickness is formed on the silicon oxide film 202. Thereafter, as shown in FIG. 7(b), a photoresist film 205 is formed by a photolithography technique, and the silicon nitride film 203 and the silicon oxide film 202 are subjected to patterning by dry etching by using the photoresist film 205 as a mask. Thereafter, the photoresist film 205 is removed (see FIG. 7(c)), and a trench 206 of about 200 nm is formed in the silicon substrate 201 by dry etching by using the silicon nitride film 203 as a mask (see FIG. 7(d)). Subsequently, a silicon oxide film 207 is formed on the silicon substrate so as to be embedded in the trench 206 by a CVD technique as shown in FIG. 7(e). Furthermore, polishing is carried out by a CMP (Chemical Mechanical Polishing) technique so that the silicon oxide film 207 remains only in the trench 206, and the silicon nitride film 203 and the silicon oxide film 202 are removed by wet etching, thereby forming a shallow trench isolation (see FIG. 7(f)).

The width WSt2 of an element isolating area of the shallow trench isolation formed as shown in FIG. 7(f) is determined by the width WSe2 of the trench 206 formed by dry etching to the silicon substrate 201 by using the silicon nitride film 203 as a mask (see FIG. 7(d)), and the element isolation area has an excellent element isolation characteristic in spite of a narrow area, so that the shallow trench isolation method has mainly prevailed as an element isolation technique best suited to recent miniaturization.

As described above, the width WSt2 of the element isolation area of the shallow trench isolation is determined by the width WSe2 of the trench 206 formed by the dry etching to the silicon substrate 201 by using the silicon nitride film 203 as a mask, so that the processing precision of the silicon nitride film 203 used as a mask is important to form the shallow trench isolation with high precision. Furthermore, when the integration degree of elements is enhanced in the future, it will be required to reduce the width of the element isolation area, and in order to satisfy this requirement, it is important to form the trench 206 at an extremely narrow width. Specifically, it is required (1) to vertically process silicon nitride film without being dependent on pattern density, (2) to process silicon nitride film so that the width thereof is smaller than the pattern interval width of a photoresist film when there is a limit to the pattern interval width of the photoresist film formed by the photolithography technique, and (3) to process silicon nitride film so that no exfoliation residual of the photoresist film occurs.

Here, the limitation of the pattern interval width of the photoresist film in the above-described (2) means a limiting resolution width (limiting resolving power) of the photolithography technique, and it is represented by the following equation: $R = k1 \times \lambda/NA$ on the optical principle when the limiting resolution width is represented by R. Here, $\lambda$ represents the wavelength of an optical source of photolithography, NA represents a numerical aperture of a projection lens, and k1 represents a value determined by the resolving power of the resist material itself and the controllability of the process. NA and $\lambda$ are varied in accordance with an exposure apparatus being used. In the case of an ArF exposing machine which is a leading-edge exposing machine, when the calculation is carried out under the condition that $\lambda$ is set to 193 nm, NA is set to 0.70, and k1 is set to 0.40, $R = 0.40 \times 193 \text{ nm}/0.70 = 110 \text{ nm}$.

A prior art 2 is disclosed as a countermeasure for the above-described (1) in Japanese Published Unexamined Patent Application No. 2000-235969. Steps until a patterning step of a silicon nitride film in the prior art 2 are shown in FIG. 8(a) to FIG. 8(d), and the same elements as FIG. 7 are represented by the same symbols. FIG. 8(a) shows a state where the silicon oxide film 202 and the silicon nitride film 203 are successively laminated on the silicon substrate 201, FIG. 8(b) shows a state where the photoresist film 205 is formed on the silicon nitride film 203 by patterning, FIG. 8(c) shows a state where the silicon nitride film is dry-etched by using the photoresist film 205 as a mask, and FIG. 8(d) shows a state where the photoresist film is removed. According to the prior art 2, $O_2$ is added to $CF_4/CHF_3/Ar$ gas so that a fluorocarbon polymer occurring in the dry etching step by oxygen radicals is prevented from adhering to a pattern side wall, whereby the silicon nitride film can be vertically dry-etched with little pattern-dependence.

However, in the prior art 2, the photoresist film 205 retrogresses by the amount corresponding to the dimension CD3 (=(WLd3−WLd3')/2=about 2 to 5 nm) because $O_2$ is added to etching gas. As a result, the pattern interval WSe3 of the silicon nitride film after the dry etching is broader than the pattern interval WSd3 (see FIG. 8(b)) of the photoresist film 205 before the dry etching, and thus the above-described (2) is not satisfied.

Furthermore, Japanese Published Unexamined Patent Application No. 2000-235969 discloses a prior art 3 as a countermeasure to the prior art 2. FIG. 9(a) to FIG. 9(e) show steps until a patterning step of the silicon nitride film in the prior art 3, and the same elements as FIG. 7 are represented by the same symbols. FIG. 9(a) shows a state where the silicon oxide film 202 and the silicon nitride film 203 are successively formed on the silicon substrate 201, FIG. 9(b) shows a state where the photoresist film 205 is formed on the silicon nitride film 203 by patterning, FIG. 9(c) shows a state where ion implantation is applied to the surface of the photoresist film 205, FIG. 9(d) shows a state where the silicon nitride film is dry-etched by using the photoresist film 205 as a mask after the ion implantation, and FIG. 9(e) shows a state where the photoresist film is removed. According to the prior art 2, as shown in FIG. 9(c), a cured layer is formed on the photoresist film 205 by doping ions 210 into the surface of the photoresist film 205, thereby enhancing the resistance to oxygen radicals. Therefore, retrogression of the photoresist film during the dry-etching of the silicon nitride film 203 can be prevented.

However, in the prior art 3, it is difficult to exfoliate the photoresist film 205b after the silicon nitride film 203 is dry-etched because the cured layer 205a is formed by doping ions into the photoresist film 205, and further there is a problem that oxide-based residual 211 comprising doped ions and oxygen atoms occurs after the exfoliation.

Japanese Published Unexamined Patent Application No. 2001-93970 discloses another prior art 4. FIG. 10(a) to FIG. 10(d) show steps until a patterning step of the silicon nitride film in the prior art 4, and the same elements as FIG. 7 are represented by the same symbols. FIG. 10(a) shows a state where the silicon oxide film 202 and the silicon nitride film 203 are successively laminated on the silicon substrate 201, FIG. 10(b) shows a state where the photoresist film 205 is formed on the silicon nitride film 203 by patterning, FIG. 10(c) shows a state where a trench having tapered side surfaces are formed in the silicon nitride film by dry etching by using the photoresist film as a mask, and FIG. 10(d) shows a state where a trench is formed by dry-etching the silicon substrate with the silicon nitride film being used as a mask.

According to the prior art 4, by increasing RF power or reducing a dry-etching gas flow-rate ratio ($CF_4/CHF_3$) when the silicon nitride film 203 is dry-etched, the silicon nitride film 203 is subjected to trench processing to have a tapered shape, so that the pattern interval WSe5 (see FIG. 10(c)) can be made smaller than the pattern interval WSd5 (see FIG. 10(b)) of the photoresist film. However, the silicon nitride film 203 is processed to have a tapered shape, and thus the tapered side surfaces of the trench of the silicon nitride film 203 serving as a mask when trench-etched in the silicon substrate 201 retrogresses during the trench etching. As a result, the pattern interval WSt5 after the trench etching of the silicon substrate 201 is larger than the pattern interval WSe5 before the trench etching.

SUMMARY OF THE INVENTION

In view of the above-described problem, the present invention has an object to provide a method for manufacturing a semiconductor device which can process a silicon nitride film vertically with a pattern interval smaller than the limiting resolution width of a photolithography technique in a patterning step of the silicon nitride film serving as a mask for trench etching when shallow isolation is formed.

In order to attain the above object, in accordance with the present invention, provided is a method for manufacturing semiconductor device comprising a first step of successively forming a silicon oxide film and a silicon nitride film on a silicon substrate, followed by forming a silicon nitride oxide film or a multilayered film containing the silicon nitride oxide film on the silicon nitride film, a second step of forming a photoresist film having an opening portion located at the position corresponding to an element isolation area of the silicon substrate on the silicon nitride film or the multilayered film according to a photolithography method, a third step of forming a trench having a pair of tapered side surface portions on the confronting side surfaces thereof on the silicon nitride oxide film or the multilayered film by using the photoresist film as a mask, the tapered side surface portions being inclined toward the substrate side so as to approach each other, and a fourth step of patterning the silicon nitride film and the silicon oxide film by dry etching by using the photoresist film and the silicon nitride oxide film or the multilayered film as a mask.

According to the present invention, it is preferable that the multilayered film consists of a polysilicon film of a lower layer at the silicon substrate side and the silicon nitride oxide film of an upper layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS OF THE INVENTION

Figure 1A:
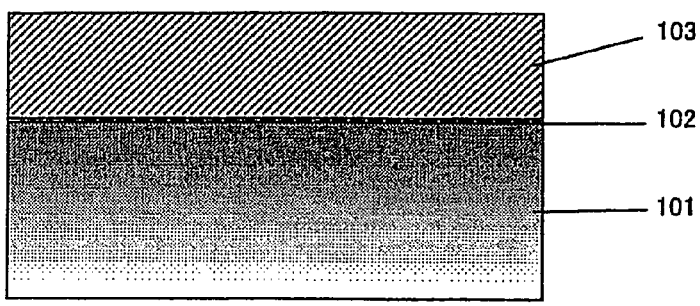
FIG. 1 is a step diagram showing a method for manufacturing a semiconductor device according to a first embodiment of the present invention.

According to the method for manufacturing the semiconductor device of the present invention, when the silicon nitride oxide film or the multilayered film containing the silicon nitride oxide film is dry-etched, the trench having at the confronting side surfaces thereof the pair of tapered side surface portions which are inclined toward the silicon substrate side so as to approach each other is formed, whereby the trench can be reliably formed so as to have a width smaller than the pattern interval of the photoresist film, and further the limiting resolution width of the photolithography method. In addition, the silicon nitride oxide film or the multilayered film containing the silicon nitride oxide film can be used as antireflection film in the patterning step of the photoresist film by the photolithography method, whereby the precision of the pattern interval and shape of the photoresist film formed in association with the element isolation area can be enhanced.

Accordingly, by carrying out the dry etching using the photoresist film and the silicon nitride oxide film or the multilayered film as a mask, a second trench having a width smaller than the limiting resolution width of the photolithography method can be vertically formed in the laminate film of the silicon nitride film and the silicon oxide film which correspond to the lower layer.

As described above, the second trench whose width is smaller than the limiting resolution width of the photolithography method can be formed in the laminate film of the silicon nitride film and the silicon oxide film with high precision, so that a third trench having a width smaller than the limiting resolution width of the photolithography technique can be formed on the silicon substrate with high precision by carrying out the dry-etching using the laminate film as a mask. Furthermore, by embedding element isolation insulating film in the third trench, the above-described problems (1), (2) and (3) of the prior arts can be overcome, and shallow trench isolation in which the element isolation area width is smaller than the above-described limiting resolution width can be formed with high precision.

Accordingly, further miniaturization of the semiconductor device can be implemented.

Furthermore, when the multilayered film comprises the polysilicon film serving as the lower layer at the silicon substrate side and the silicon nitride oxide film serving as the upper layer, the following advantages can be achieved:

(A) the silicon nitride oxide film can be selectively etched by dry etching, and the depth control of the etching of the silicon nitride oxide film can be made easy, so that the width of the bottom of the trench can be controlled with higher precision;

(B) the silicon nitride oxide film serving as the upper layer is practically used as interference film to exposure light and the polysilicon film serving as the lower layer is practically used as film for reflecting exposure light, and thus the photoresist film can be formed with high precision of pattern dimension and shape, so that the precision of the pattern interval and shape of the trench in the silicon substrate can be further enhanced; and (C) the film reduction of the silicon nitride film when the third trench is formed by dry etching can be prevented, so that the film thickness of the silicon nitride film can be controlled with high precision.

The present invention relates to a method for manufacturing a semiconductor device having shallow trench isolation (embedded element isolation insulating film) to form plural minute semiconductor elements on a silicon substrate, and a flash memory or the like is applied as a target semiconductor device.

Furthermore, a monocrystal silicon substrate or a polycrystal silicon substrate may be used as the silicon substrate.

In the present invention, a well known technique such as a thermal oxidation method, an anode oxidation method, a plasma oxidation method, a CVD method, a sputtering method, a deposition method or the like may be used as a method for forming a silicon oxide film on a silicon substrate, and the present invention is not limited to a special method. However, the thermal oxidation method is preferable.

Furthermore, a well known method such as the CVD method, the sputtering method, the deposition method or the like may be used as a method for forming a silicon nitride film on a silicon oxide film, and the present invention is not limited to a special method. However, the CVD method is preferable.

Furthermore, a well known technique such as the CVD method, the sputtering method, the deposition method or the like may be used as a method for forming a polysilicon film and/or silicon nitride oxide film on a silicon nitride film, and the present invention is not limited to a special method. However, the CVD method is preferable.

In the present invention, there is adopted a method for adjusting the angle of the tapered side surface portions of the trench to the flat surface of the substrate and/or the trench depth of the portion corresponding to the tapered side surface portions by dry etching and forming the trench in the third step.

In these methods, there is a case (a) where the trench is formed by forming a pair of tapered side surface portions until they reach the silicon nitride film, and a case (b) where a pair of tapered side surface portions are formed at a first angle to the flat surface of the substrate until a substantially upper half portion of the trench depth, and then the lower side surface portions are formed from the lower ends of the pair of tapered side surface portions at a second angle to the flat surface of the substrate until they reach the silicon nitride film.

In the case of (a), the taper angle $\theta_1$ of the tapered side surface portions to the flat surface of the substrate is set to satisfy $70° \leq \theta_1 \leq 90°$, and preferably to $70° \leq \theta_1 < 80°$. In the present etching technique, it is difficult to set the taper angle $\theta_1$ to less than 70°. However, if the etching technique is enhanced, the taper angle may be set to about 45° which is smaller than 70°. On the other hand, if the taper angle $\theta_1$ is above 90°, it would be impossible to form a trench having a width smaller than the pattern interval (the width of the opening portion) of the photoresist film, and thus this taper angle is not preferable.

In the case of (b), the taper angle (the first angle) $\theta_1$ of the tapered side surface portions to the flat surface of the substrate is set to satisfy $70° \leq \theta_1 \leq 90°$ (preferably to $85° \leq \theta_1 < 90°$), and the taper angle (the second angle) $\theta_2$ of the lower side surface portions to the flat surface of the substrate is set to satisfy $\theta_1 \leq \theta_2 \leq 90°$, preferably $\theta_2$ is set to 88° to 90°, and more preferably $\theta_2$ is set to 90°. In this method (b), the formation of the tapered side surface portions of the trench is completed before they reach the silicon nitride film, and thereafter the lower side surface portions are substantially vertically formed so as to satisfy $\theta_1 \leq \theta_2 \leq 90°$, so that a margin before dry etching is started in the substantially vertical direction to the silicon nitride film and the silicon oxide film which serve as the lower layer can be secured.

In the third step of the present invention, the dry etching gas is not limited to a special material insofar as it has etching ability in the dry etching of the silicon nitride oxide film, and for example $CF_4/CHF_3/Ar$, $CF_4/CHF_3/O_2$ or $CF_4/CHF_3/Ar/O_2$ gas is preferable.

As an etching condition of the silicon nitride oxide film in the third step, in a case where the taper angle $\theta_1$ of the tapered side surface portions of the trench is set to satisfy $\theta_1 < 90°$, for example, the condition of pressure: 50 to 150 mTorr, RF power: 300 to 900 W, gas type/flow rate: $CF_4/CHF_3/Ar=2$ to $8/25$ to $75/75$ to $225$ sccm may be adopted. Furthermore, in a case where the angle $\theta_2$ of the lower side surface portions of the trench is set to satisfy $88° \leq \theta_2 \leq 90°$, for example, the condition of pressure: 50 to 150 mTorr, RF power: 300 to 900 W, gas type/flow rate: $CF_4/CHF_3/O_2=20$ to $60/25$ to $75/8$ to $25$ sccm may be adopted.

Furthermore, in the multilayered film, the same etching gas as described above is used for the dry etching of the silicon nitride oxide film and the polysilicon film which serve as the upper layer and lower layer.

In the case of the multilayered film, when the silicon nitride oxide film and the polysilicon film are continuous with each other and the taper angle $\theta_1$ is set to satisfy $\theta_1<90'$, the same condition as described above is applied to the silicon nitride oxide film, and the condition of pressure: 75 to 200 mTorr, RF power: 300 to 600 W, gas type/flow rate: $CF_4/CHF_3/O_2=20$ to 60/20 to 100/10 to 20 sccm is adopted for the polysilicon film. In the case where the trench is formed while the taper angle $\theta_1$ of the tapered side surface portions of the silicon nitride oxide film is set to satisfy $\theta_1<90°$ and then the angle $\theta_2$ of the lower side surface portions of the polysilicon film is set to satisfy $88 \leq \theta_2 \leq 90°$, the condition of pressure: 30 to 150 mTorr, RF power: 400 to 900 W, gas type/flow rate: $CF_4/CHF_3/O_2=30$ to 100/10 to 80/10 to 30 sccm is adopted.

Furthermore, in the fourth step, the present invention is not limited especially to a dry etching material insofar as dry etching gas having etching capability is used in the dry etching step of silicon nitride film and silicon oxide film, however, $CF_4/CHF3/Ar$, $CF_4/CHF_3/O_2$ or $CF_4/CHF_3/Ar/O_2$ gas is preferable.

An etching condition of pressure: 50 to 150 mTorr, RF power: 300 to 900 W, gas type/flow rate: $CF_4/CHF_3/Ar=20$ to 60/25 to 75/10 to 25 sccm is set in the fourth step to trench-process silicon nitride film and silicon oxide film substantially vertically.

Embodiments of the present invention will be described below with reference to the accompanying drawings, however, the present invention is not limited to the following embodiments.

[First Embodiment]

Figure 3:
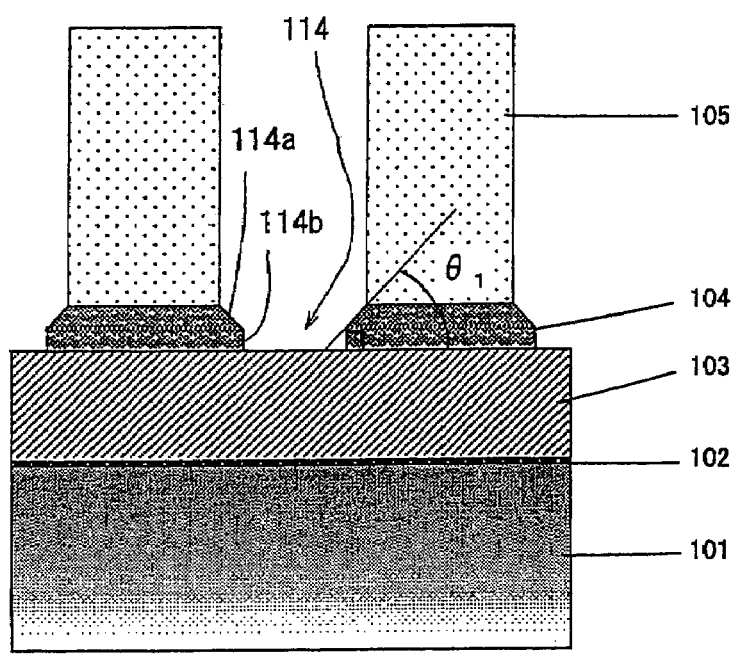
FIG. 3 is an another diagram of FIG. 1(d).

FIG. 1 is a step diagram showing a semiconductor device manufacturing method according to a first embodiment of the present invention, wherein (a) shows a state where a silicon oxide film and a silicon nitride film are successively formed on a silicon substrate, (b) shows a state where a silicon nitride oxide film is formed on the silicon nitride film, (c) shows a state where a photoresist film is formed on the silicon nitride oxide film by patterning, (d) shows a state where the silicon nitride oxide film is dry-etched by using the photoresist film as a mask, (e) shows a state where the silicon nitride film and the silicon oxide film are dry-etched by using the photoresist film and the silicon nitride oxide film as a mask, and (1) shows a state where the photoresist film is removed. FIG. 3 is an another diagram of FIG. 1(d).

Figure 1B:
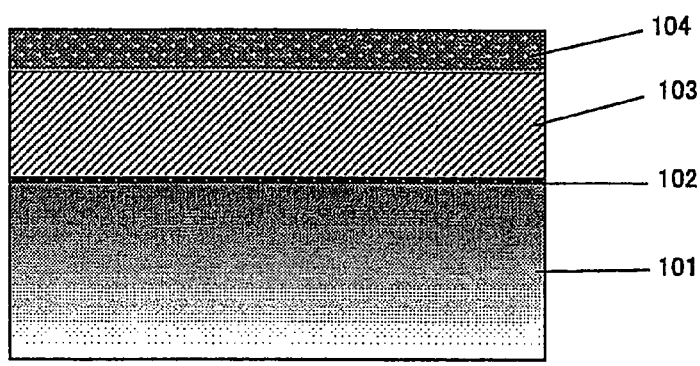

According to the method for manufacturing the semiconductor device of the first embodiment, as shown in FIG. 1(a), a silicon oxide film 102 is first formed at a desired film thickness on the whole upper surface of a silicon substrate 101 by thermal oxidation, and a silicon nitride film 103 is formed at a desired film thickness on the upper surface of the silicon oxide film 102 by the CVD method. Subsequently, as shown in FIG. 1(b), a silicon nitride oxide film 104 is formed at a desired film thickness on the silicon nitride film 103 by the CVD method.

Figure 1C:
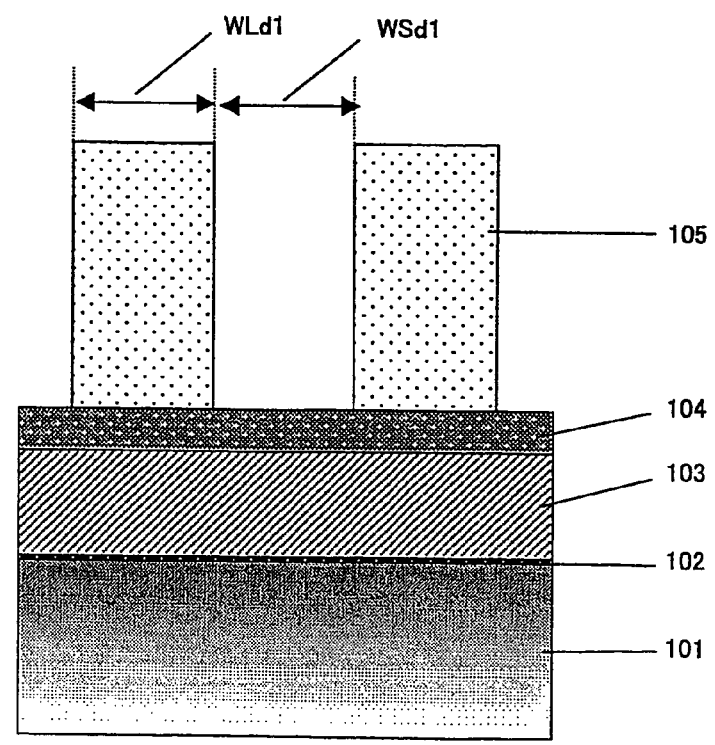
Figure 1D:
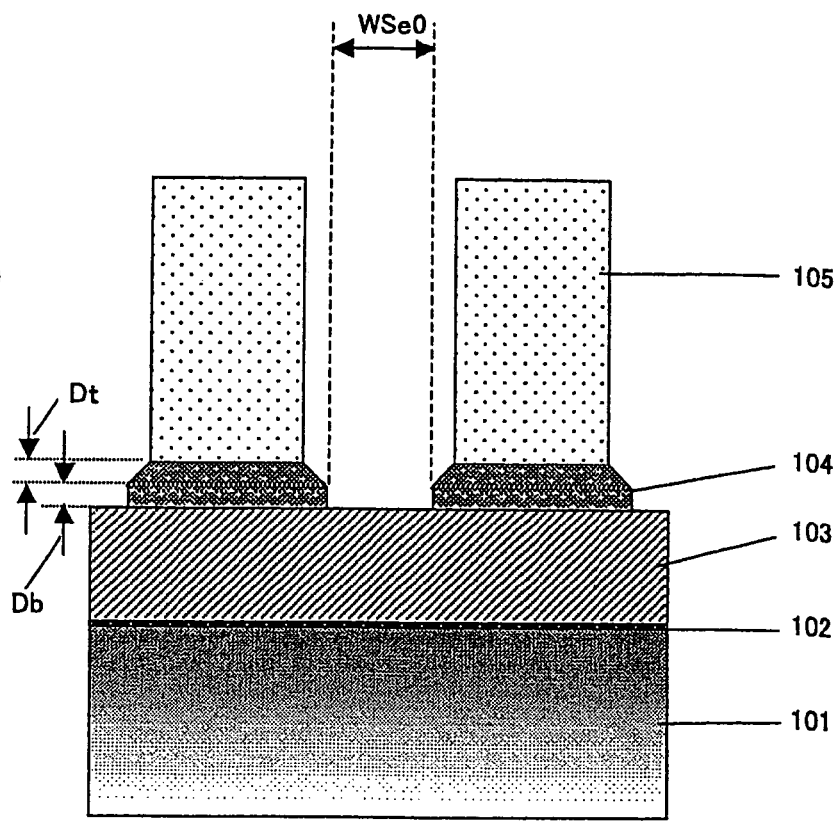

Subsequently, as shown in FIG. 1(c), a photoresist material is applied at a desired film thickness on the silicon nitride oxide film 104, and a photoresist film 105 is shaped to have a desired form by the photolithography method. Thereafter, as shown in FIGS. 1(d) and 3, the silicon nitride oxide film 104 is dry-etched by RIE (Reactive Ion Etching) by using the photoresist film 105 as a mask to form a trench 114. At this time, the dry etching is carried out so that a pair of tapered side surface portions 114a which are inclined toward the substrate side at a taper angle $\theta_1$: 70 to 89° so as to approach each other are formed at the upper half portion Dt of the trench 114, and subsequently a pair of lower side surface portions 114b which are substantially vertical to the flat surface of the substrate (angle $\theta_2$: 89 to 90°) are formed at the lower half portion Db of the trench 114. Accordingly, the patterning interval of the silicon nitride oxide film 104 (the width of the bottom portion of the first trench 114) WSe0 can be set to be smaller than the interval WSd1 of the photoresist film 105.

Figure 1E:
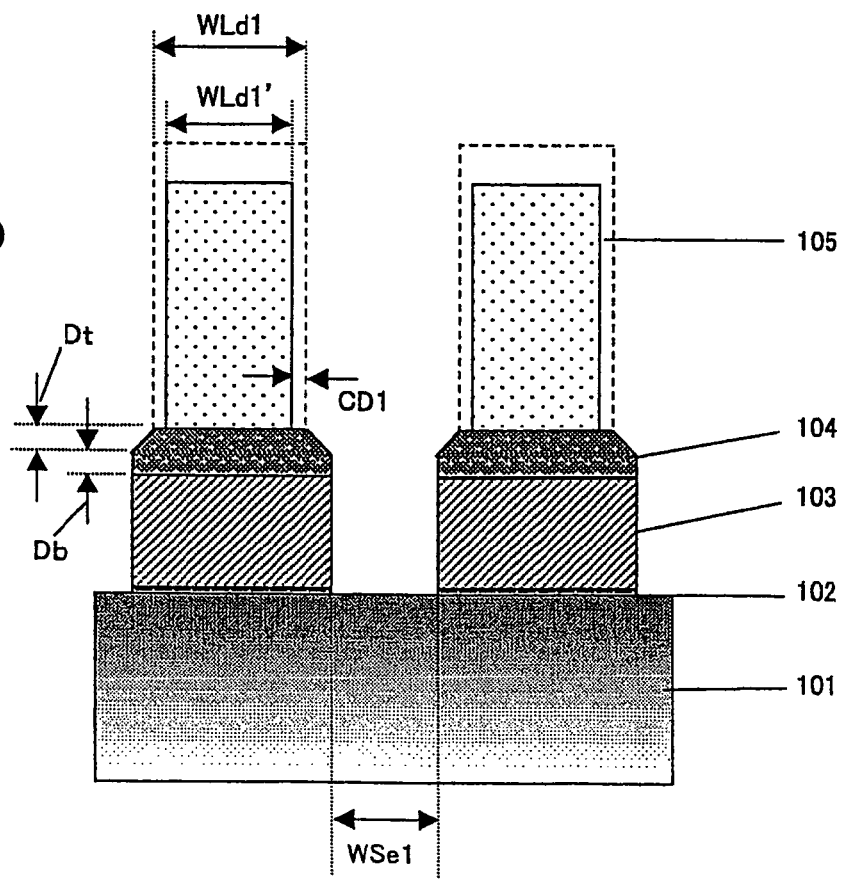
Figure 1F:
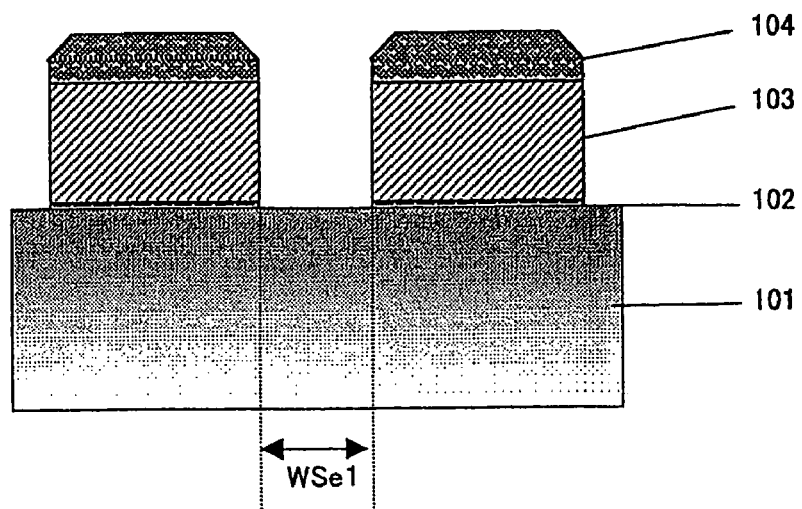

Subsequently, as shown in FIG. 1(e), the silicon nitride film 103 and the silicon oxide film 102 are dry-etched by RIE by using as a mask the photoresist film 105 and the silicon nitride oxide film 104 which is patterned with the photoresist film 105. At this time, a reaction products (deposition materials) adhere to the side surfaces of the silicon nitride oxide film 104 (the tapered side surface portions 114a and the lower side surface portions 114b of the trench 114), and the reaction products serve as protection film, so that the side surfaces of the silicon nitride oxide film 104 are protected. Therefore, no retrogression of the side surfaces of the silicon nitride oxide film 104 by the dry etching occurs. By the dry etching, the pattern interval WSe1 of the silicon nitride film 103 serving as the mask of the trench etching when the shallow trench isolation is formed can be reduced to be less than the interval WSd1 of the photoresist film 105 as shown in FIG. 1(f).

In the first embodiment, the patterning interval WSe0 of the upper portion Dt of the silicon nitride oxide film 104 is smaller than the patterning interval WSd1 of the photoresist film 105 by $2Dt/\tan\theta_1$. Specifically, it can be reduced by 12 nm in the case of $\theta_1=80°$ and Dt=35 nm, or reduced by 25 nm in the case of $\theta_1=70°$ and Dt=35 nm.

According to the above-described first embodiment, in the step of patterning the silicon nitride film 103 serving as the mask for the trench etching when shallow trench isolation is formed, the trench 114 having the tapered side surface portions 114a inclined toward the flat surface of the substrate and the substantially vertical lower side surface portions 114b is formed in the silicon nitride oxide film 104, and the silicon nitride oxide film 104 is used as the mask for the dry etching of the silicon nitride film 103 together with the photoresist film 105. Therefore, as shown in FIG. 1(e), even when resist retrogression CDI (=WLd1−WLd1') occurs in the photoresist film 105 during the etching of the silicon nitride film 103, the silicon nitride film 103 can be vertically grooved at a pattern interval WSe1 smaller than the pattern interval WSd1 of the photoresist film 105, and the silicon nitride film 103 can be grooved in connection with the shallow trench isolation width smaller than the limiting resolution width of the photolithography technique. Furthermore, when the silicon nitride oxide film 104 is used as the antireflection film in the photolithography process, the precision of the pattern interval and shape of the photoresist film 105 can be enhanced.

[Second Embodiment]

Figure 4:
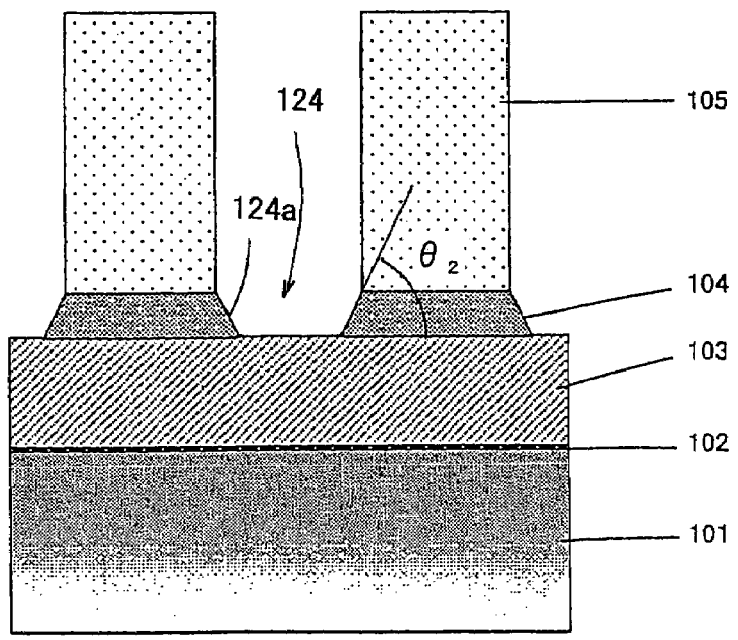
FIG. 4 is an another diagram of FIG. 2(d).

FIG. 2 is a step diagram showing a method for manufacturing a semiconductor device according to a second embodiment of the present invention, wherein (a) shows a state where a silicon oxide film and a silicon nitride film are successively formed on a silicon substrate, (b) shows a state where a silicon nitride oxide film is formed on the silicon nitride film, (c) shows a state where a photoresist film is formed on the silicon nitride oxide film by patterning, (d) shows a state where the silicon nitride oxide film is dry-etched by using the photoresist film as a mask, (e) shows a state where the silicon nitride film and the silicon oxide film are dry-etched by using the photoresist film and the silicon nitride oxide film as a mask, and (f) shows a state where the photoresist film is removed. FIG. 4 is an another diagram of FIG. 2(d). In FIG. 2 and FIG. 4, the same elements as FIG. 1 are represented by the same symbols.

Figure 2A:
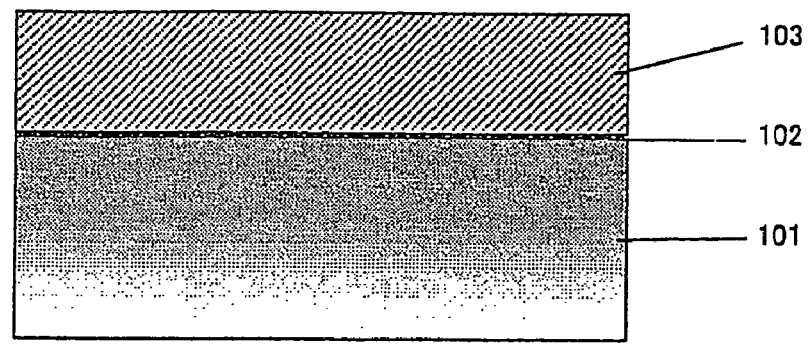
FIG. 2 is a step diagram showing a method for manufacturing a semiconductor device according to a second embodiment of the present invention.
Figure 2B:
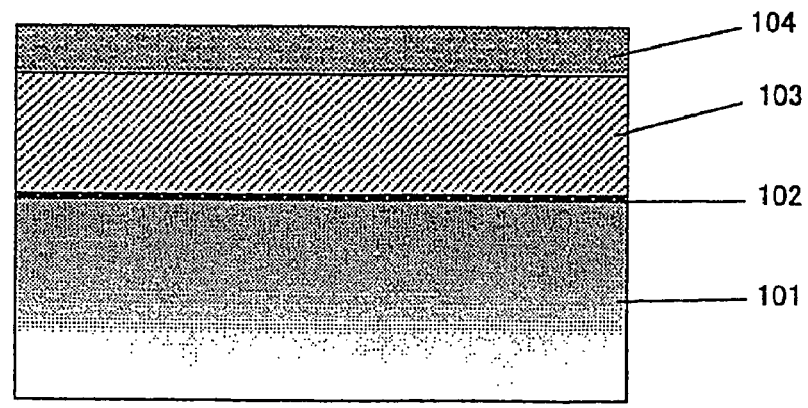
Figure 2C:
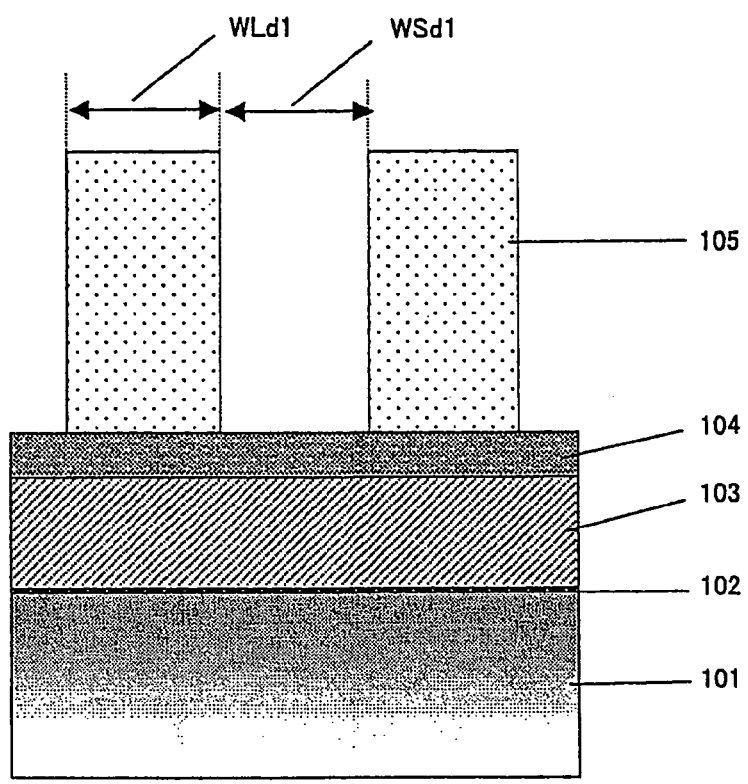
Figure 2D:
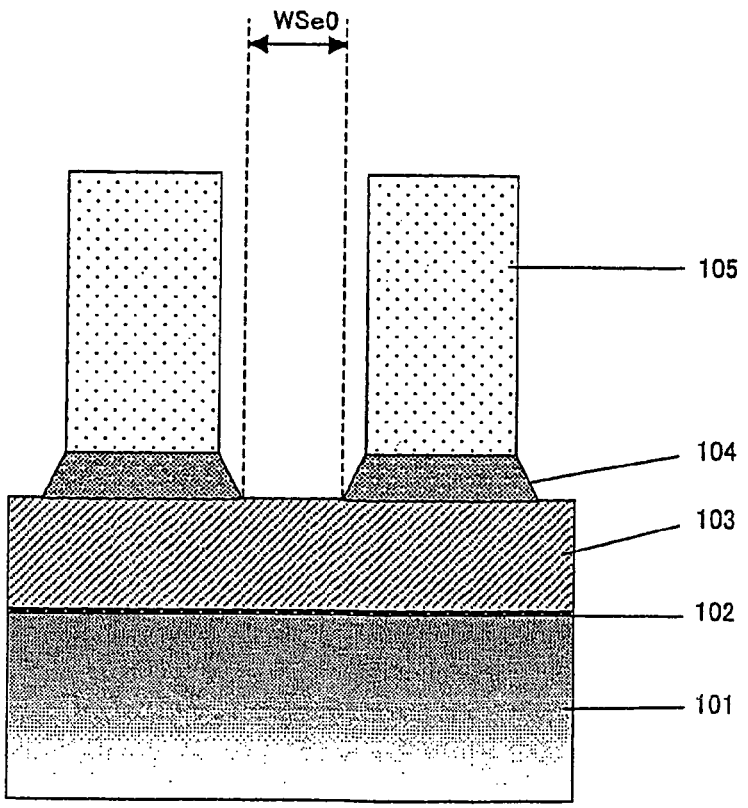

In the method for manufacturing the semiconductor device according to the second embodiment, the dry etching step of the silicon nitride oxide film 104 shown in FIG. 2(d) is different from that of the first embodiment, while other steps are the same as the first embodiment. Different points of the second embodiment from the first embodiment will be mainly described below.

First, as shown in FIG. 2(a) and FIG. 2(b), the silicon oxide film 102, the silicon nitride film 103 and the silicon nitride oxide film 104 are formed at a desired film thicknesses on the upper surface of the silicon substrate 101. Subsequently, as shown in FIG. 2(c), a photoresist material is applied at a desired film thickness, and photoresist film 105 having a desired pattern is formed by the photolithography technique.

Subsequently, as shown in FIG. 2(d) and FIG. 4, the silicon nitride oxide film 104 is dry-etched by RIE (Reactive Ion Etching) by using the photoresist film 105 as a mask to form a trench 124. At this time, the dry etching is carried out so that a pair of confronting side surfaces of the trench 124 become a pair of tapered side surface portions 124a inclined toward the substrate side at a taper angle $\theta_1$: 70 to 89° so as to approach each other until the pair of confronting side surfaces reach the silicon nitride film 103. Accordingly, the patterning interval WSe0 of the silicon nitride oxide film 104 is smaller than the interval WSd1 of the photoresist film 105.

Figure 2E:
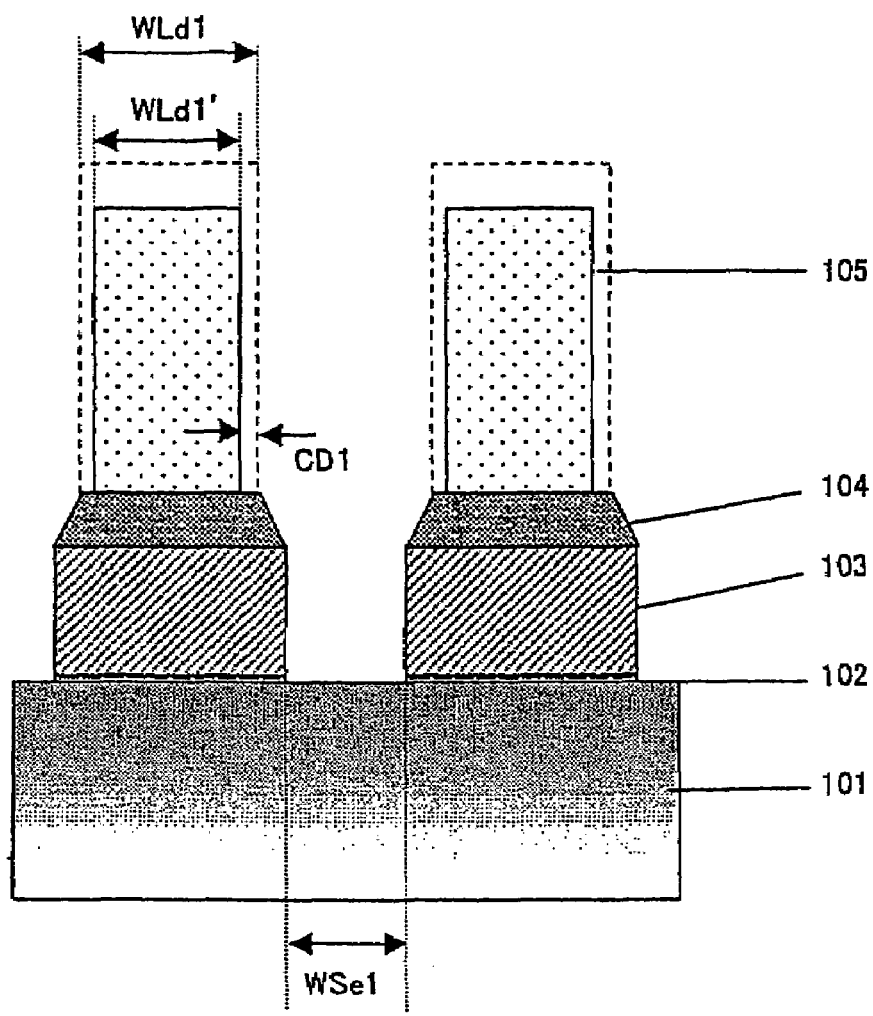
Figure 2F:
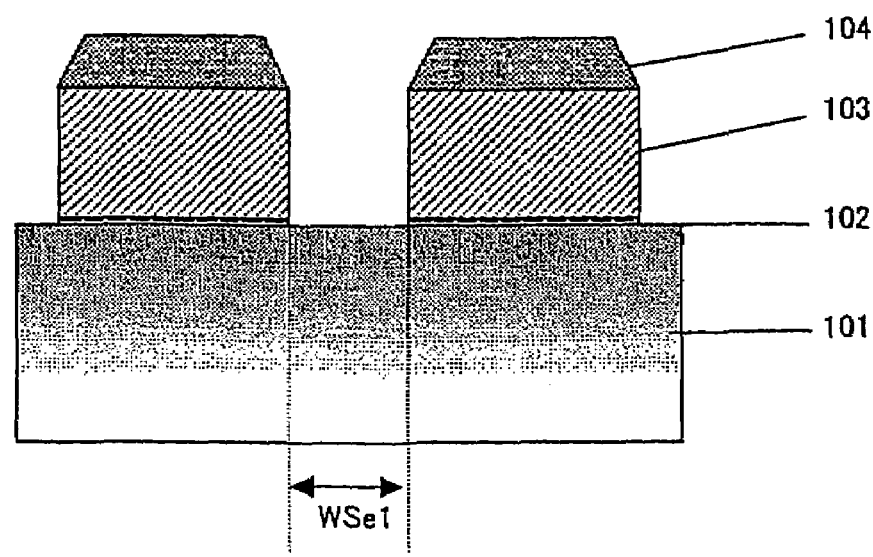

Thereafter, as shown in FIG. 2(e), the silicon nitride film 103 and the silicon oxide film 102 are dry-etched by RIE by using the photoresist film 105 and the patterned silicon nitride oxide film 104 as a mask. At this time, reaction products (deposition materials) adhere to the side surfaces of the silicon nitride oxide film 104 (the tapered side surface portions 124a of the trench 124) and the reaction products serve as protection film, so that the side surfaces of the silicon nitride oxide film 104 are protected. Therefore, there occurs no retrogression of the side surfaces of the silicon nitride oxide film 104 by the dry etching. By the dry etching, the pattern interval WSe1 of the silicon nitride film 103 serving as the mask for the trench etching when the shallow trench isolation is formed can be made less than the interval WSd1 of the photoresist film 105 as shown in FIG. 2(f).

In the second embodiment, in the patterning step of the silicon nitride film 103 serving as the mask for the trench etching when the shallow trench isolation is formed, the trench 124 whose confronting side surfaces have the tapered side surface portions 124a inclined toward the flat surface of the substrate at a taper angle $\theta_1$: 70 to 89° is formed in the silicon nitride oxide film 104, and the silicon nitride oxide film 104 is used as the mask for the dry etching of the silicon nitride film 103 together with the photoresist film 105. Therefore, even when resist retrogression CDl (=WLdl−WLdl') occurs in the photoresist film 105 during the dry etching of the silicon nitride film 103, the silicon nitride film 103 can be vertically grooved at the pattern interval WSe1 smaller than the pattern interval WSd1 of the photoresist film 105, so that the silicon nitride film 103 can be processed in connection with the shallow trench isolation width smaller than the limiting resolution width of the photolithography technique. Furthermore, if the silicon nitride oxide film 104 is used as the antireflection film in the photolithography process, it would be expected that the precision of the pattern interval and shape of the photoresist film 105 is enhanced.

[Third Embodiment]

FIG. 5 is a step diagram showing a method for manufacturing a semiconductor device according to a third embodiment of the present invention, wherein (a) shows a state where a silicon oxide film and a silicon nitride film are successively formed on a silicon substrate, (b) shows a state where a multilayered film consists of a polysilicon film and a silicon nitride oxide film is formed on the silicon nitride film, (c) shows a state where a photoresist film is formed on the multilayered film by patterning, (d) shows a state where the multilayered film is dry-etched by using the photoresist film as a mask, (e) shows a state where the silicon nitride film and the silicon oxide film are dry-etched by using the photoresist film and the multilayered film as a mask, and (f) shows a state where the photoresist film is removed. FIG. 6 is a subsequent step diagram of FIG. 5, wherein (a) shows a state where natural oxide film on the surface of the semiconductor substrate is removed by dry etching, and (b) shows a state where a trench is formed in the surface of the semiconductor substrate. In FIG. 5 and FIG. 6, the same elements as FIG. 1 are represented by the same symbols.

Figure 5A:
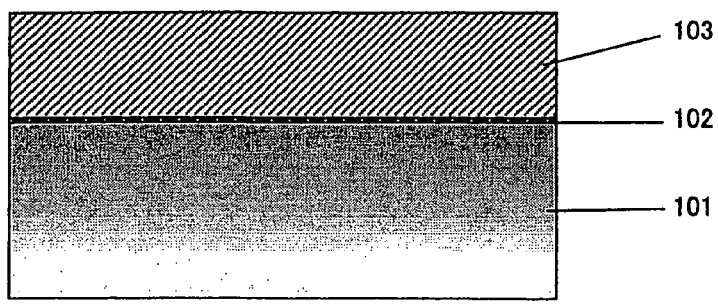
FIG. 5 is a step diagram showing a method for manufacturing a semiconductor device according to a third embodiment of the present invention.
Figure 5B:
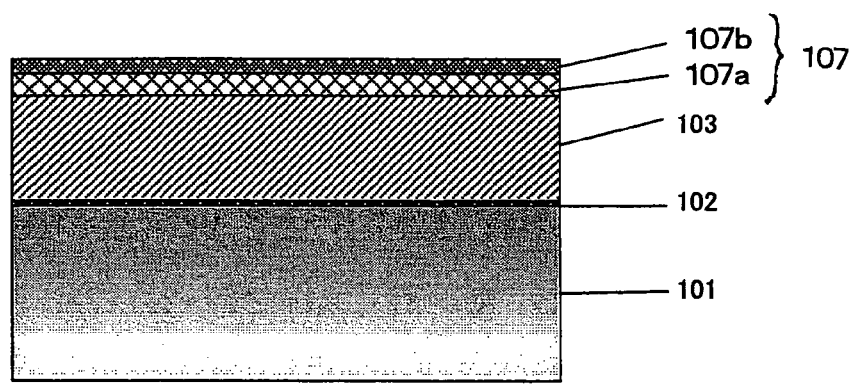

The method for manufacturing the semiconductor device of the third embodiment is different from the first embodiment in the step of forming the multilayered film 107 shown in FIG. 5(b), while other steps are the same as the first embodiment. Different points of the third embodiment from the first embodiment will be mainly described below.

First, as shown in FIG. 5(a), the silicon oxide film 102 and the silicon nitride film 103 are formed at a desired film thicknesses on the upper surface of the silicon substrate 101. Subsequently, as shown in FIG. 5(b), the polysilicon film 107a and the silicon nitride oxide film 107b are successively laminated at a desired film thicknesses on the silicon nitride film 103 to form a multilayered film 107. Thereafter, a photoresist material is applied at a desired thickness on the multilayered film 107, and the photoresist film 105 is shaped to have a desired pattern by the photolithography technique.

Figure 5C:
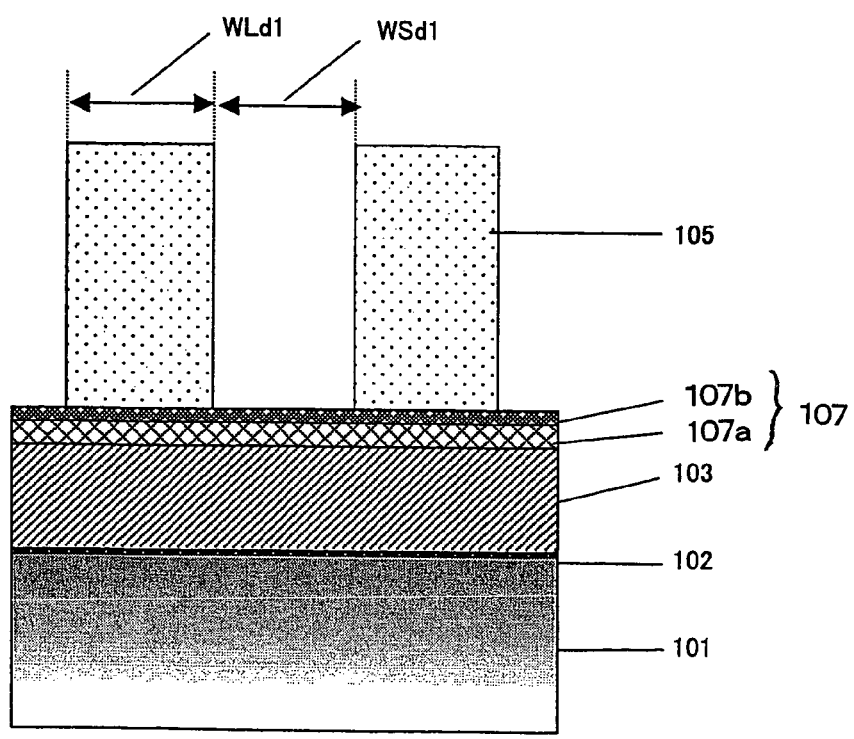
Figure 5D:
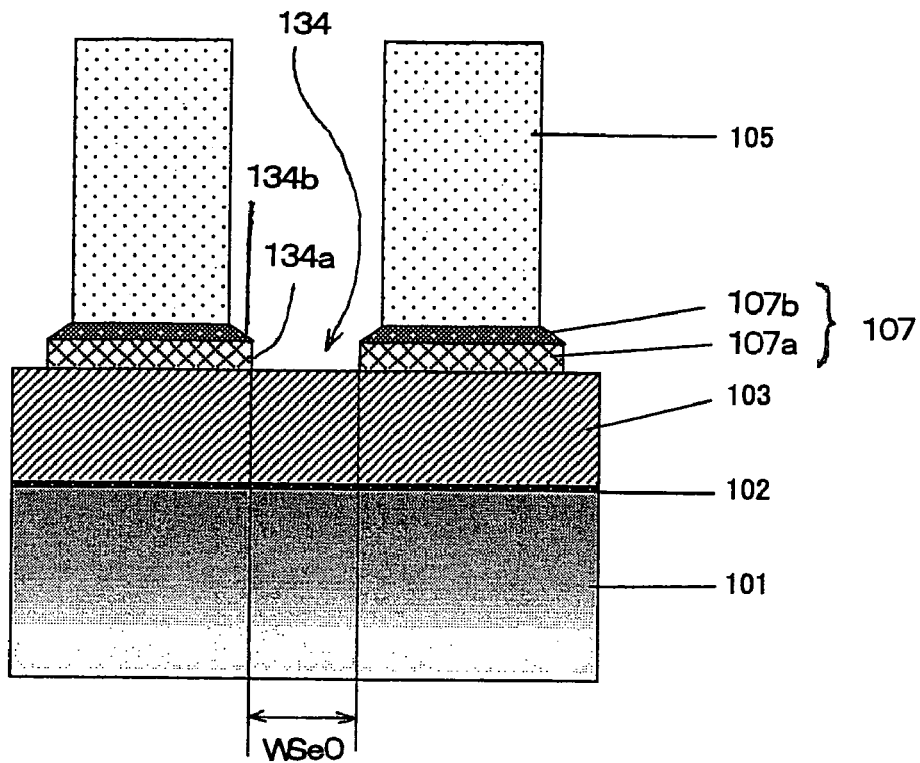

Subsequently, as shown in FIG. 5(d), the silicon nitride oxide film 107b of the multilayered film 107 is dry-etched by RIE (Reactive Ion Etching) by using the photoresist film 105 as a mask to form a trench 134. At this time, a pair of confronting side surfaces of the trench 134 are inclined at a taper angle $\theta_1$: 70 to 89° toward the substrate side so as to approach each other until they reach the polysilicon film 107a, thereby forming a pair of tapered side surface portions 134b. Subsequently, the polysilicon film 107a is dry-etched so as to form a pair of lower side surface portions 134a which is substantially vertical to the flat surface of the substrate (angle of 89 to 90°). Accordingly, the patterning interval of the multilayered film 107 (the width of the bottom portion of the first trench 134) WSe0 is smaller than the interval WSd1 of the photoresist film 105.

Figure 5E:
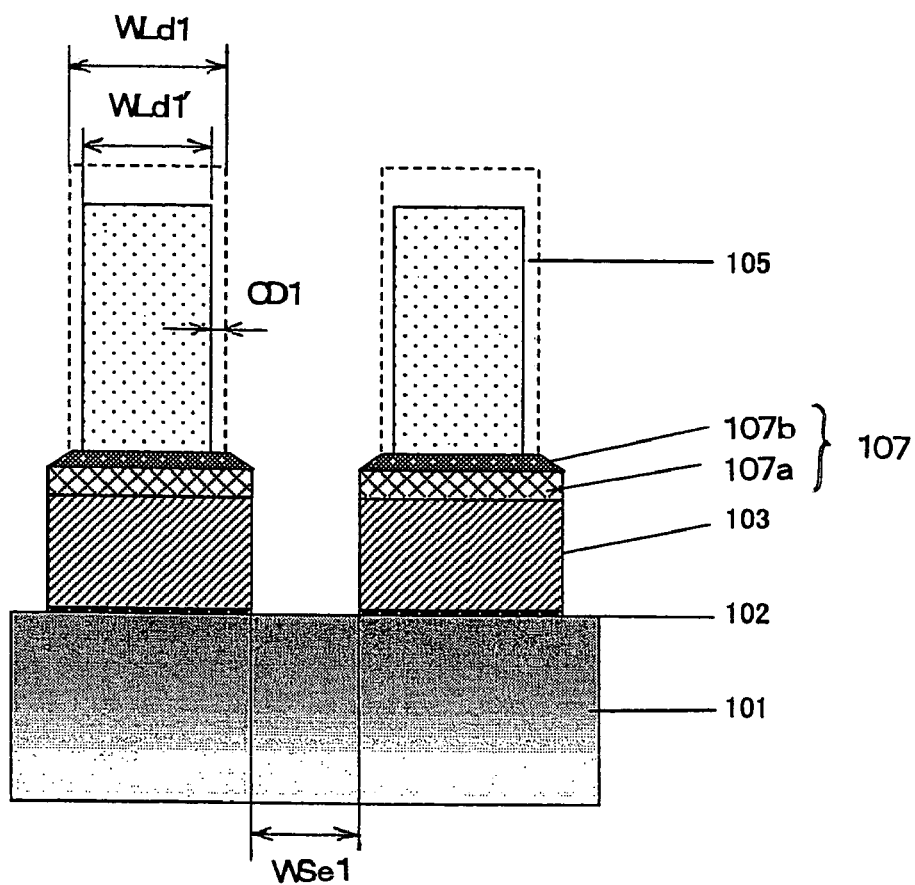

Thereafter, as shown in FIG. 5(e), the silicon nitride film 103 and the silicon oxide film 102 are dry-etched through RIE by using the photoresist film 105 and the patterned multilayered film 107 as a mask. At this time, reaction products (deposition materials) adhere to the side surfaces of the multilayered film 107 the tapered side surface portions 134b and the lower side surface portions 134a of the trench 134) and the reaction products serve as protection film to protect the side surfaces of the multilayered film 107, so that there occurs no retrogression of the side surfaces of the multilayered film 107 by the dry etching. As a result of this dry etching, the pattern interval WSe1 of the silicon nitride film 103 serving as the mask of the trench etching when the shallow trench isolation is formed can be reduced to be smaller than the interval WSd1 of the photoresist film 105 as shown in FIG. 5(e).

Figure 5F:
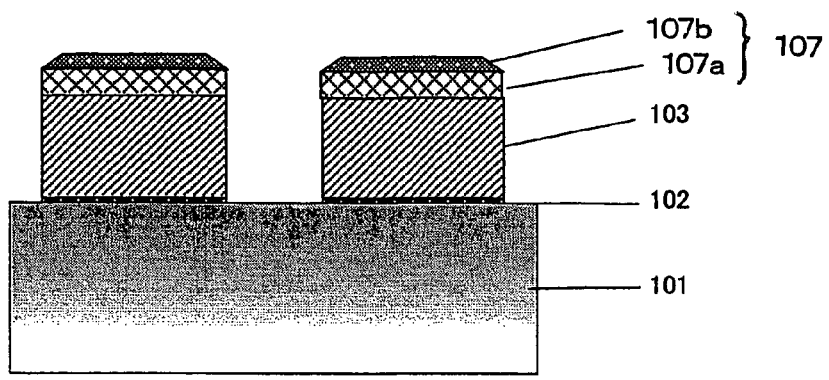
Figure 6A:
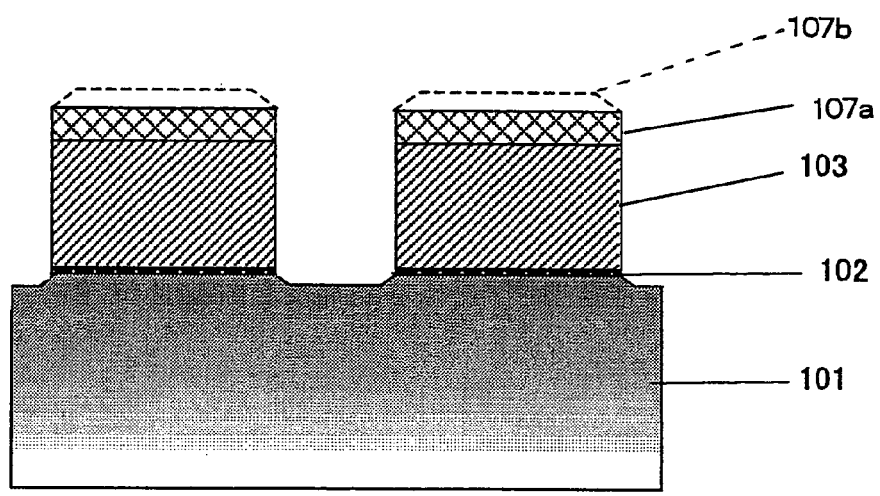
FIG. 6 is a step diagram subsequent to FIG. 5.

As shown in FIG. 5(f), after the photoresist film is removed, the dry etching is carried out by using the multilayered film 107 and the silicon nitride film 103 as a mask to remove the natural oxide film on the surface of the semiconductor substrate (the surface of the bottom portion of the trench 134) as shown in FIG. 6(a). In the dry etching step, the silicon nitride oxide film 107b as well as the natural oxide film is removed. At this time, the dry etching is carried out until the polysilicon film 107a serving as the lower layer is exposed (or a slight amount of the silicon nitride oxide film 107b, for example, at most about 20 nm in thickness remains).

Figure 6B:
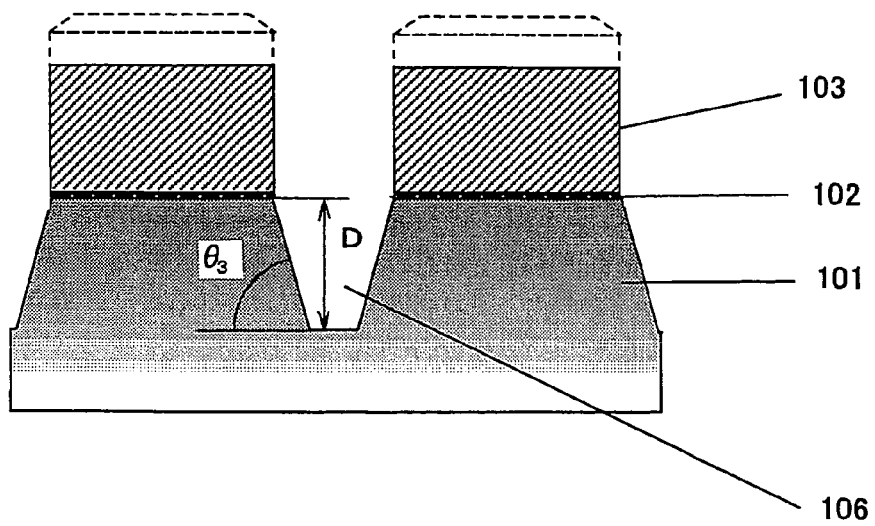
Figure 7A:
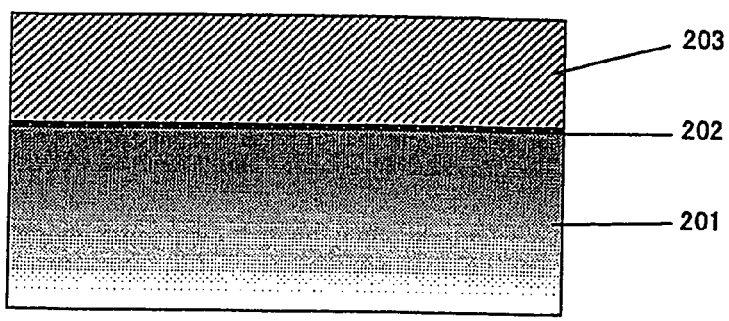
FIG. 7 is a step diagram showing a method for manufacturing a semiconductor device of a prior art 1.
Figure 7B:
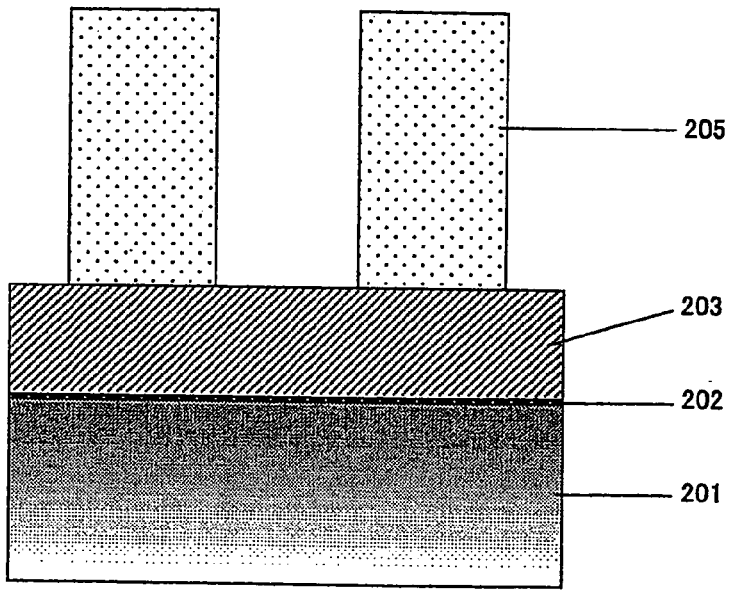
Figure 7C:
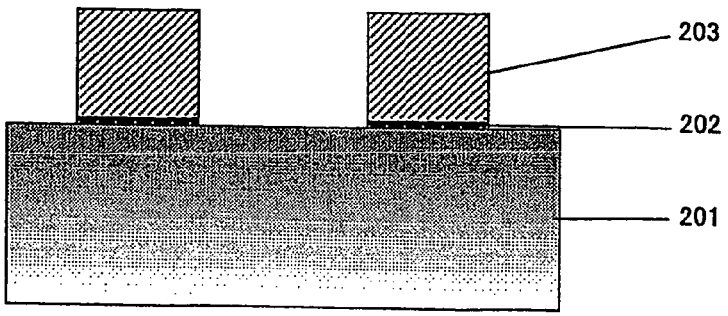
Figure 7D:
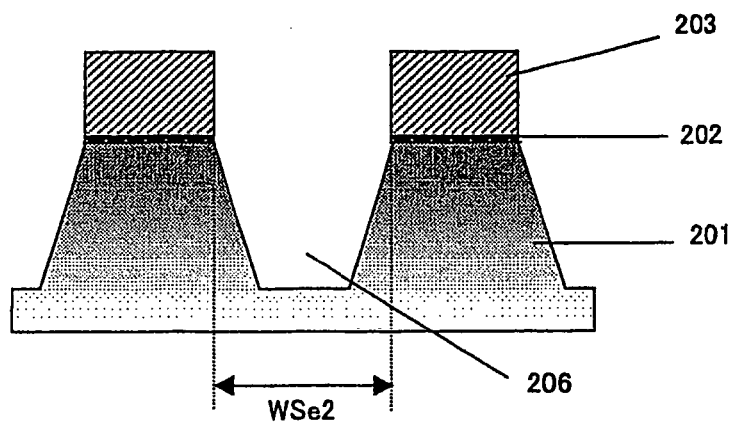
Figure 7E:
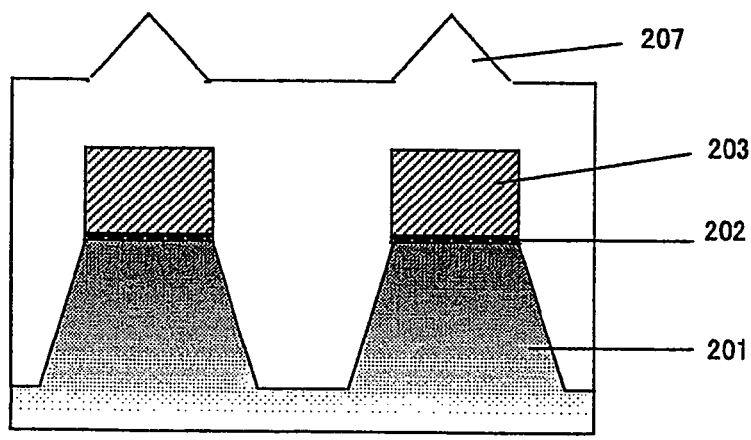
Figure 7F:
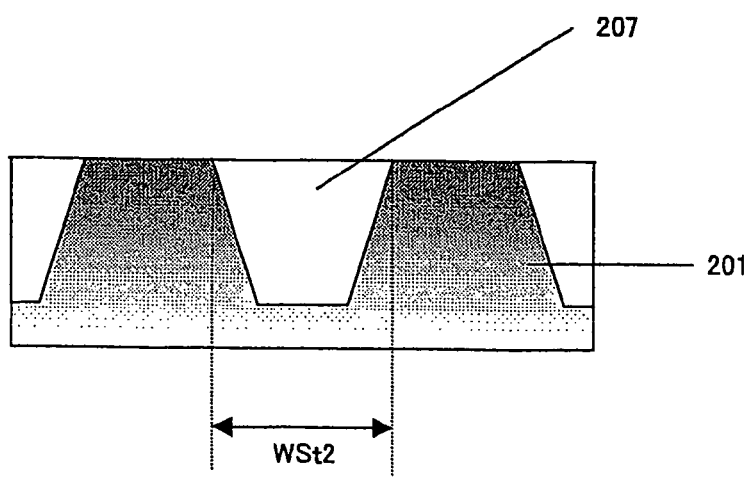
Figure 8A:
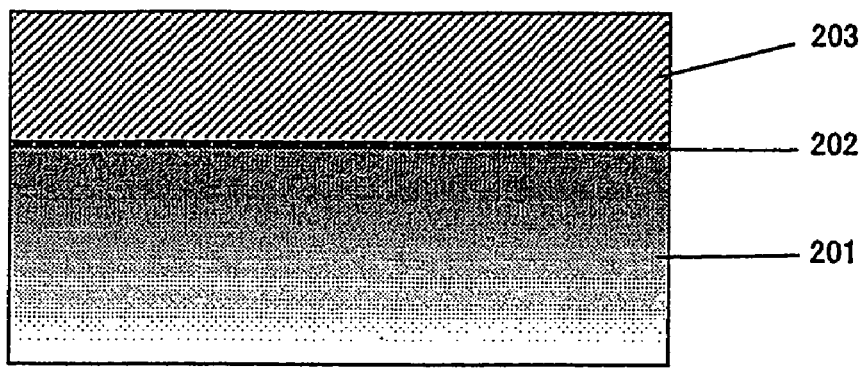
FIG. 8 is a step diagram showing a method for manufacturing a semiconductor device of a prior art 2.
Figure 8B:
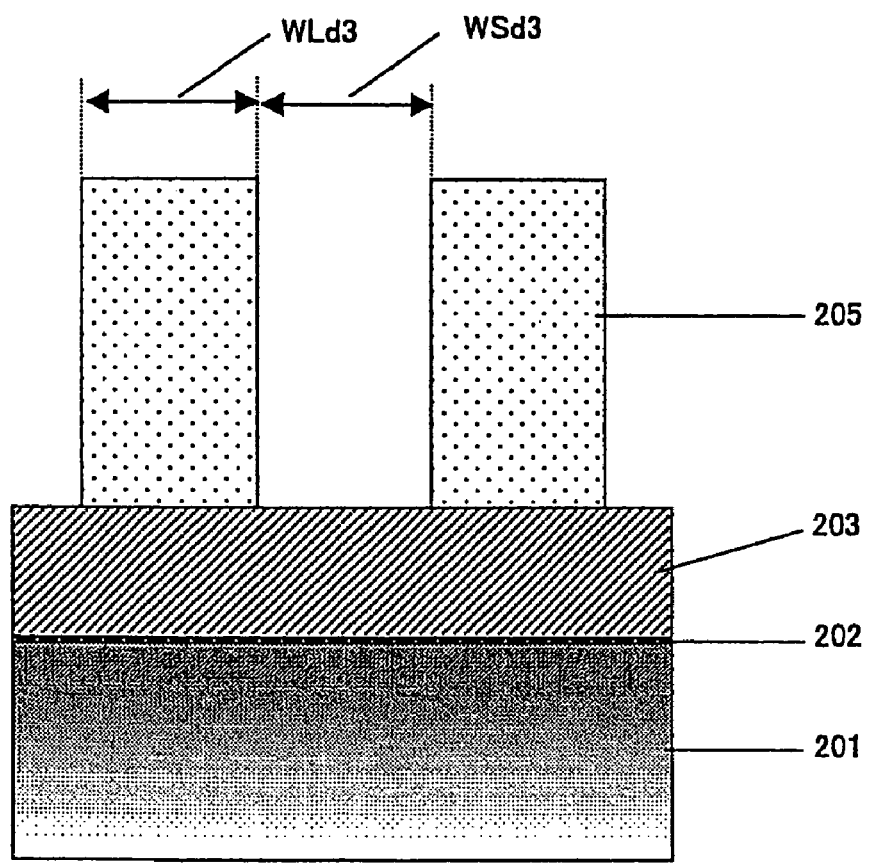
Figure 8C:
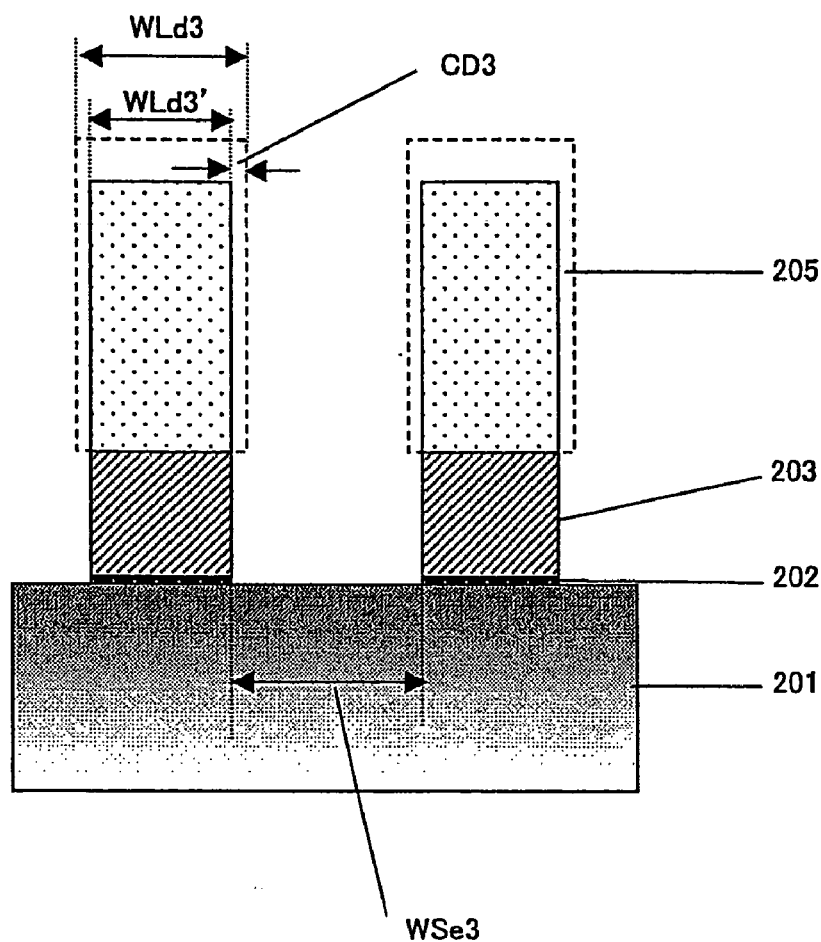
Figure 8D:
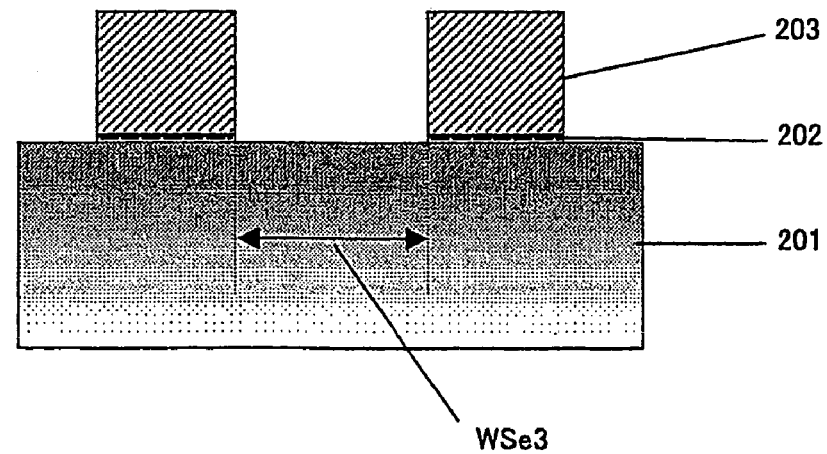
Figure 9A:
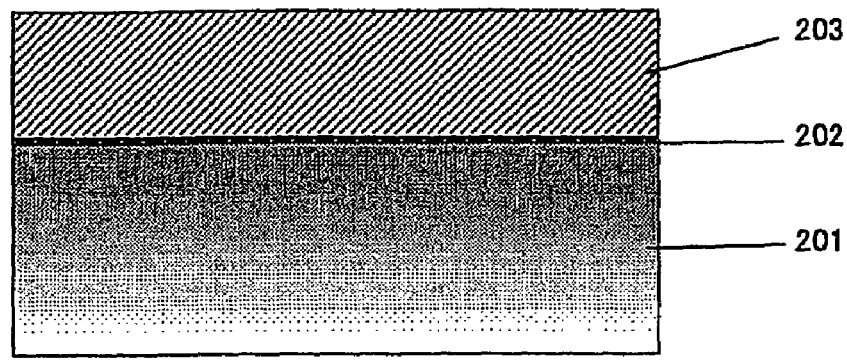
FIG. 9 is a step diagram showing a method for manufacturing a semiconductor device of a prior art 3.
Figure 9B:
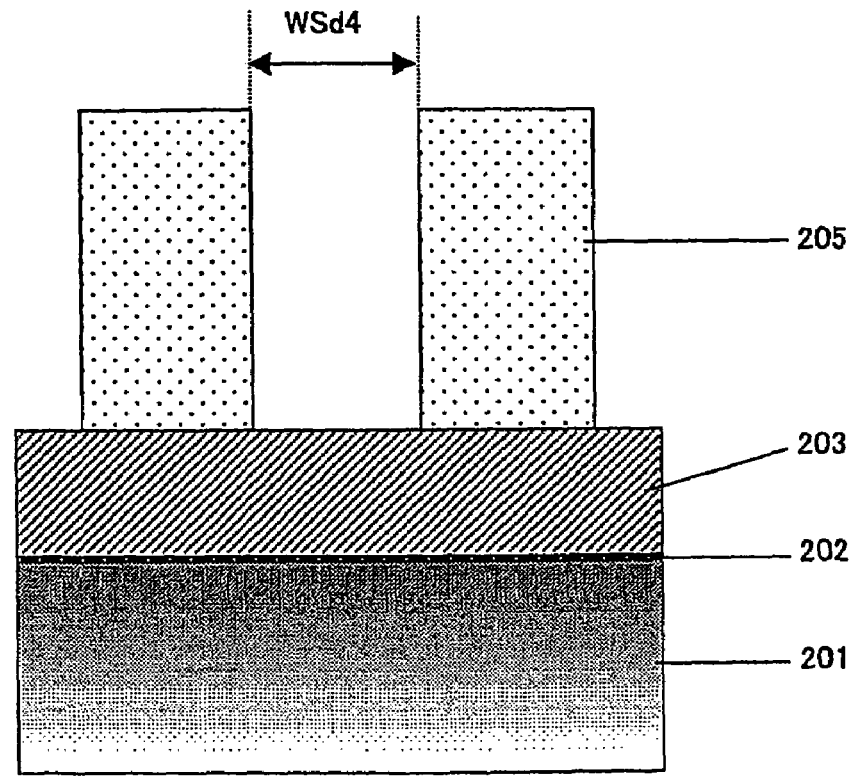
Figure 9C:
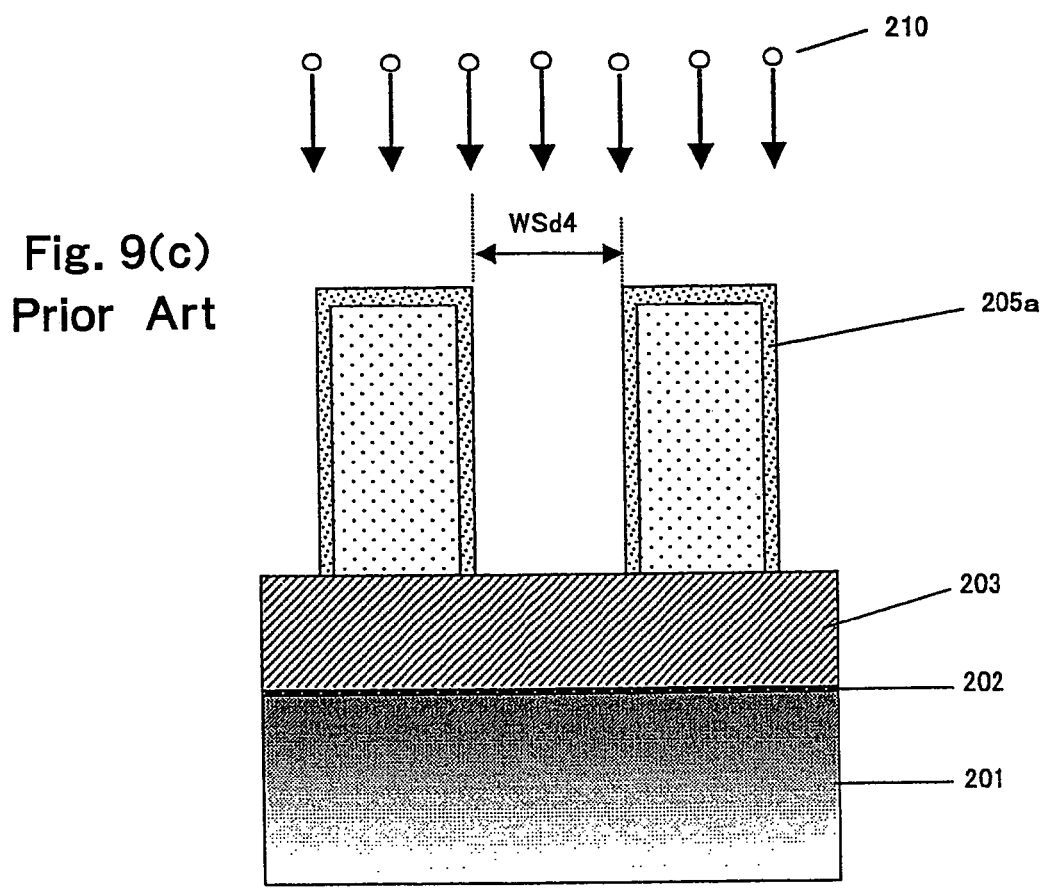
Figure 9D:
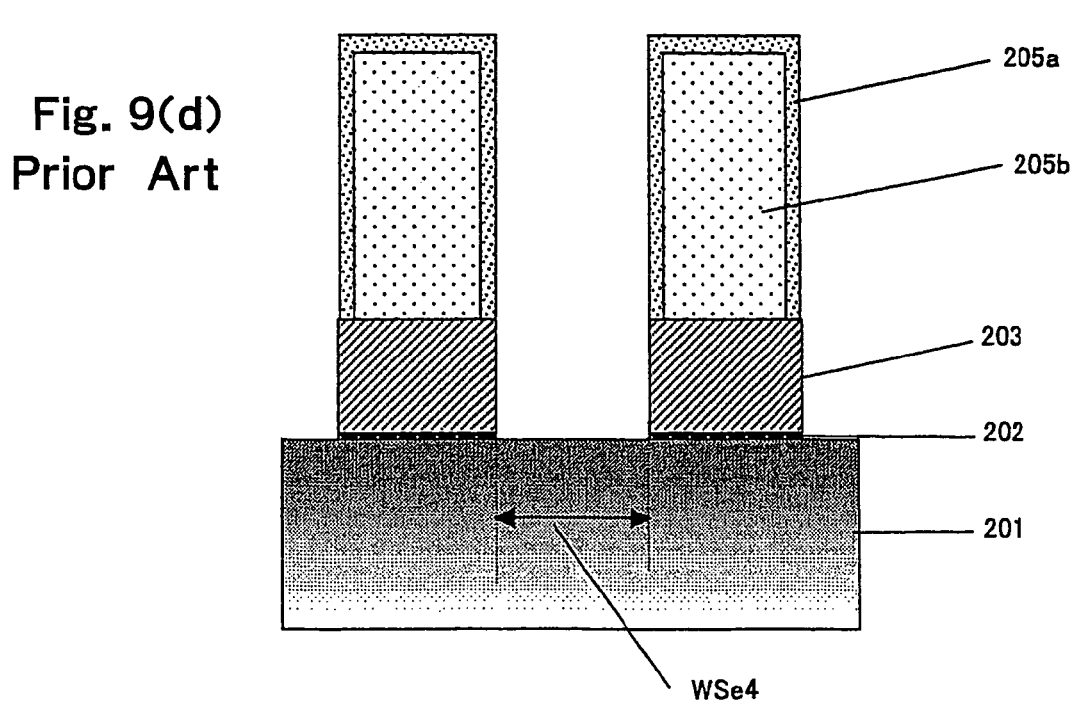
Figure 9E:
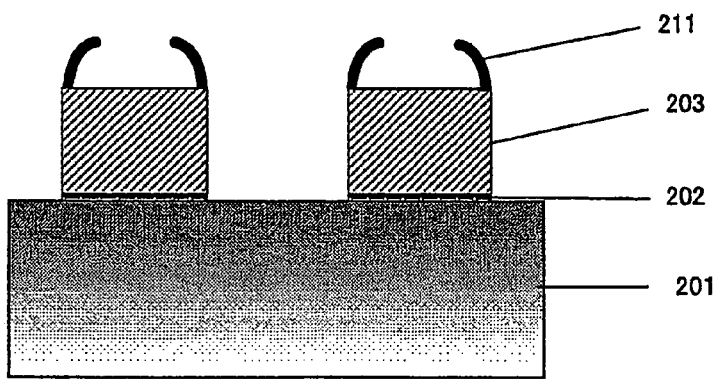
Figure 10A:
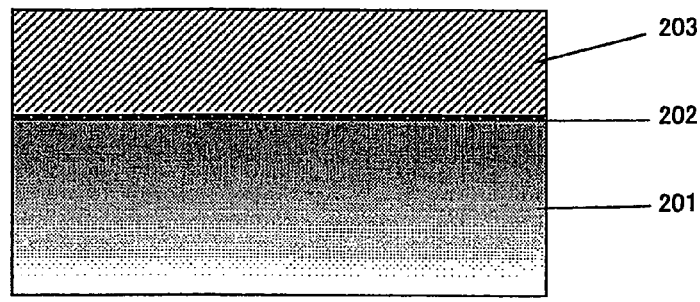
FIG. 10 is a step diagram showing a method for manufacturing a semiconductor device of a prior art 4.
Figure 10B:
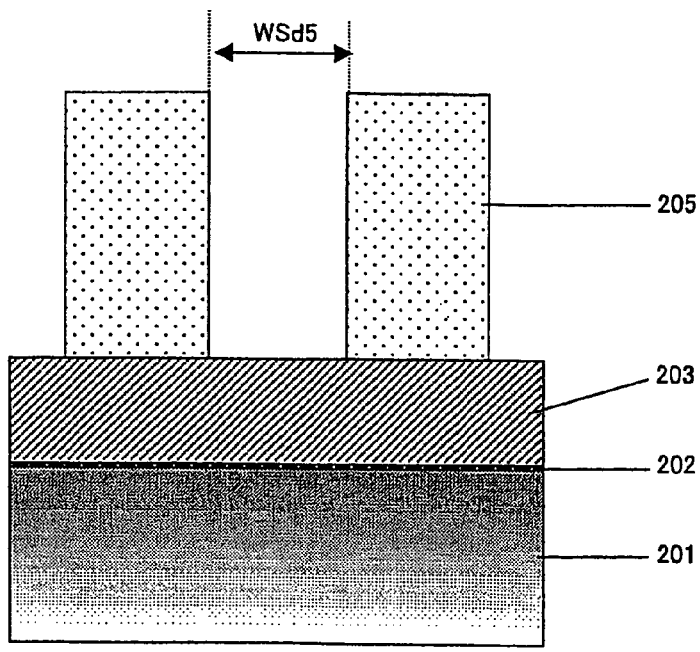
Figure 10C:
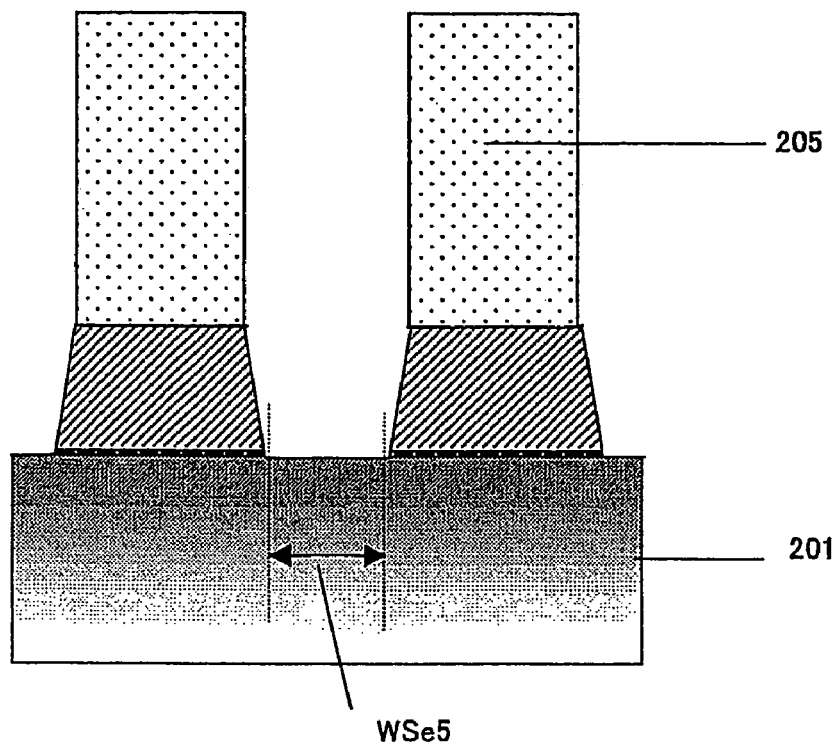
Figure 10D:
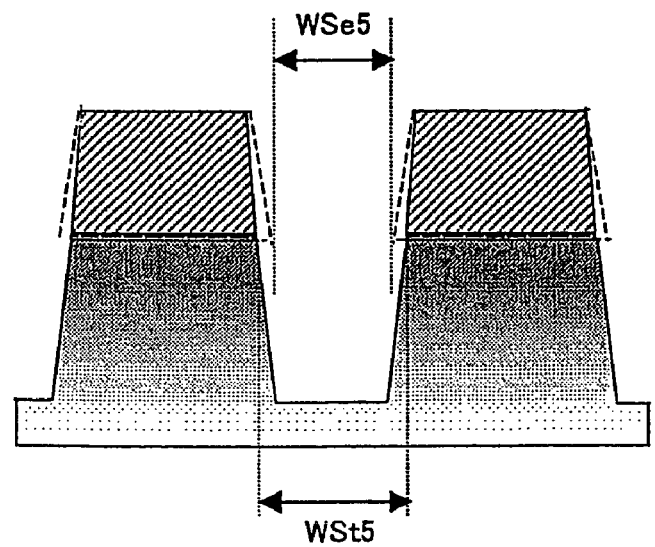

Thereafter, as shown in FIG. 6(b), the remaining polysilicon film 107a (or the remaining silicon nitride oxide film 107b and polysilicon film 107a) is dry-etched to form a trench 106 for element isolation in the silicon substrate 101 and also expose the silicon nitride film 103.

According to the third embodiment, the trench having the tapered side surface portions 134b having the taper angle $\theta_1$: 70 to 89° (see FIG. 3) with respect to the flat surface of the substrate and the lower side surface portions 134a which are substantially vertical to the flat surface of the substrate is formed in the step of patterning the multilayered film 107 serving as the mask for the trench etching when the shallow trench isolation is formed, and the multilayered film 107 is used as the mask for the dry etching of the silicon nitride film 103 together with the photoresist film 105. Therefore, even when resist retrogression CDI (=WLd1−WLd1') of the photoresist film 105 occurs during the dry etching step of the silicon nitride film 103, the silicon nitride film 103 can be vertically grooved at a pattern interval WSe1 smaller than the pattern interval WSd1 of the photoresist film 105, and the silicon nitride film 103 can be processed in connection with the shallow trench isolation width smaller than the limiting resolution width of the photolithography technique.

According to the manufacturing method of the present invention, the following advantages can be achieved.

That is, in the third embodiment, the multilayered film consists of the silicon nitride oxide film serving as the upper layer and the polysilicon film serving as the lower layer which are formed of different materials, so that the silicon nitride oxide film can be selectively etched by dry etching and the etching depth of the silicon nitride oxide film can be easily controlled, and thus the width of the bottom of the trench can be controlled with high precision. As a result, the formation of the trench in the silicon nitride film and the formation of the trench in the silicon substrate can be performed with high precision.

Since the silicon nitride oxide film serving as the upper layer can be practically used as interference film to exposure light and the polysilicon film serving as the lower layer can be practically used as film for reflecting exposure light, the photoresist film can be formed with high precision of the pattern dimension and shape, so that the precision of the pattern interval and the shape of the trench in the silicon substrate can be further enhanced.

Recently, much attention has been paid to a process of forming a trench in a silicon substrate, embedding the trench with insulating film to carry out element isolation and then forming a gate in an active region between insulating film in a self-alignment style. In this process, silicon nitride film which serves as an etching mask when the trench is formed in the silicon substrate is removed, film of a gate material is formed on the overall surface of the substrate and then polishing is carried out by CMP, thereby forming the gate in the self-alignment style. Therefore, the film thickness of the silicon nitride film after the trench etching is carried out on the silicon substrate affects the film thickness of the gate film and the variation of the film thickness. That is, in order to form the gate with desired values for the gate thickness and the variation of the gate thickness, the film thickness of the silicon nitride film after the trench etching can be controlled with high precision. In the third embodiment, since the polysilicon film is formed between the silicon nitride oxide film and the silicon nitride film, each of the silicon nitride oxide film and the polysilicon film can be selectively etched, and the film thickness of the silicon nitride film below the silicon nitride oxide film and the polysilicon film can be kept to the film thickness at the time when it is formed, so that the gate thickness and the variation of the gate thickness can be controlled with high precision in the process as described above.

EXAMPLE 1

As shown in FIG. 1(a), $SiO_2$ film 102 of about 10 nm in thickness was formed on a P-type silicon substrate 101 by thermal oxidation, and then silicon nitride film ($Si_3N_4$ film) 103 of about 140 nm in thickness was formed by a pressure-reduced CVD (Chemical Vapor Deposition) method. Subsequently, as shown in FIG. 1(b), silicon nitride oxide film (SiON) 104 of about 80 nm in thickness was formed on the silicon nitride film 103 by the normal-pressure CVD method. Thereafter, a photoresist material was applied on the whole surface of the upper surface of the silicon nitride oxide film 104, and the photoresist film 105 corresponding to a desired shallow trench isolation pattern as shown in FIG. 1(c) was formed by the photolithography technique. At this time, the silicon nitride oxide film 104 can be practically used as antireflection film in the photolithography process, and the photoresist film 105 having high precision in pattern dimension and shape can be formed.

Subsequently, as shown in FIG. 1(d), the upper half portion Dt of the silicon nitride oxide film 104 was first dry-etched with an RIE (Reactive Ion Etching) equipment by using the photoresist film 105 as a mask so that the intersecting angle $\theta_1$ between each side surface of the trench and the flat surface of the substrate was equal to 75°. Specifically, the dry etching was carried out under a mixture gas plasma condition in which the pressure was set to 100 mTorr, the RF power applied to the lower electrode was set to 600 W and the gas flow rate was set to $CF_4:CHF_3:Ar=5:50:150$ sccm. Subsequently, dry etching was also carried out on the lower half portion Db of the silicon nitride oxide film 104 so that the intersecting angle $\theta_2$ between each lower side surface of the trench and the flat surface of the substrate was equal to 90° under a mixture gas plasma condition in which the pressure was set to 100 mTorr, the RF power applied to the lower electrode was set to 500 W and the gas flow rate was set to $CF_4:CHF_3:O_2=40:50:16.5$ sccm.

Thereafter, as shown in FIG. 1(e), the silicon nitride film 103 was dry-etched by using the photoresist film 105 and the patterned silicon nitride oxide film 104 as a mask under a mixture gas plasma condition in which the pressure was set to 100 mTorr, the Rf power applied to the lower electrode was set to 500 W and the gas flow rate was set to $CF_4:CHF_3:O_2=40:50:16.5$ sccm. Subsequently, the silicon oxide film 102 was dry-etched under a mixture gas plasma condition in which the pressure was set to 100 mTorr, the RF power applied to the lower electrode was set to 600 W and the gas flow rate was set to $CF_4:CHF_3:Ar=5:50:150$ sccm. Thereafter, as shown in FIG. 1(f), the photoresist film 105 was removed by $O_2$ plasma.

As a result of Example 1, the silicon nitride film 103 could be vertically grooved so as to have a pattern interval smaller than the photoresist film 105, and the silicon nitride film 103 could be processed in connection with the shallow trench isolation width smaller than the limiting resolution width of the photolithography technique. Specifically, a trench having a width of 90 nm could be formed in the silicon nitride film 103 with respect to the limiting resolution width 110 nm of the photolithography technique. Furthermore, in the exfoliation step of the photoresist film 105 after the dry etching, ashing providing no photoresist film exfoliation residual can be performed.

In Example 1, in the patterning step of the dry etching of the silicon nitride oxide film 104, the side surfaces of the upper half portion are formed in the silicon nitride oxide film 104 so as to be tapered with respect to the base substrate, and also the side surfaces of the lower half portion of the silicon nitride oxide film 104 are formed so as to be substantially vertical to the base substrate. The present invention is not limited to this example, and the silicon nitride oxide film 104 may be dry-etched so that the side surfaces are tapered with respect to the base substrate until they reach the silicon nitride film 103.

EXAMPLE 2

As shown in FIG. 5(a), $SiO_2$ film 102 of about 10 nm in thickness was formed on a P-type silicon substrate 101 by thermal oxidation, and then silicon nitride film ($Si_3N_4$ film) 103 of about 140 nm in thickness was formed by the pressure-reduced CVD (Chemical Vapor Deposition) method. Subsequently, as shown in FIG. 5(b), polysilicon film 107a of about 50 nm in thickness was formed on the silicon nitride film 103 by the pressure-reduced CVD method, and further silicon nitride oxide film (SiON) 107b of about 30 nm in thickness was formed on the polysilicon film 107a by the normal-pressure CVD method. Thereafter, a photoresist material was applied on the whole surface of the upper surface of the silicon nitride oxide film 107b, and a photoresist film 105 was formed in connection with a desired shallow trench isolation pattern as shown in FIG. 5(c). At this time, the polysilicon film 107a and the silicon nitride oxide film 107b can be practically used as antireflection film having a dual structure in the photolithography process, that is, the silicon nitride oxide film 107b serving as the upper layer can be practically used as interference film to exposure light, and the polysilicon film 107a serving as the lower layer can be practically used as film for reflecting exposure light, so that the photoresist film 105 can be formed with high precision in pattern dimension and shape.

Subsequently, as shown in FIG. 5(d), the silicon nitride oxide film 104b was dry-etched with an RIE (Reactive Ion Etching) equipment by using the photoresist film 105 as a mask so that the intersecting angle $\theta_1$ between each side surface of the trench and the flat surface of the substrate was equal to 75° (see FIG. 3). Specifically, the dry etching was carried out under a mixture gas plasma condition in which the pressure was set to 100 mTorr, the RF power applied to the lower electrode was set to 600 W and the gas flow rate was set to $CF_4:CHF_3:Ar=5:50:150$ sccm. Subsequently, the dry etching was also carried out under a mixture gas plasma condition in which the pressure was set to 150 mTorr, the RF power applied to the lower electrode was set to 400 W and the gas flow rate was set to $CF_4:CHF_3:O_2=40:50:18$ sccm so that the intersecting angle $\theta_2$ between each lower side surface of the trench and the flat surface of the substrate was equal to 90° with respect to the polysilicon film 107b (see FIG. 3).

Thereafter, as shown in FIG. 5(e), the silicon nitride film 103 was dry-etched by using the photoresist film 105, the patterned silicon nitride oxide film 107b and the polysilicon film 107a as a mask under a mixture gas plasma condition in which the pressure was set to 100 mTorr, the RF power applied to the lower electrode was set to 500 W and the gas flow rate was set to $CF_4:CHF_3:O_2=40:50:16.5$ sccm. Subsequently, the silicon oxide film 102 was dry-etched under a mixture gas plasma condition in which the pressure was set to 100 mTorr, the RF power applied to the lower electrode was set to 600 W and the gas flow rate was set to $CF_4:CHF_3:Ar=5:50:150$ sccm. Thereafter, as shown in FIG. 5(f), the photoresist film 105 was removed by $O_2$ plasma.

As described above, the silicon nitride film 103 could be vertically grooved so as to be narrower in width than the pattern interval of the photoresist film 105, and the silicon nitride film 103 could be processed in connection with the shallow trench isolation width smaller than the limiting resolution width of the photolithography technique. Specifically, a trench of 90 nm in width could be formed in the silicon nitride film 103 with respect to the limiting resolution width of 110 nm in the photolithography technique.

Subsequently, the silicon nitride oxide film 107b, the polysilicon oxide film 107a, the silicon nitride film 103 and the silicon oxide film 102 were processed as described above, and then the following silicon trench etching was carried out on a shallow trench isolation formed portion by an ICP (Inductively Coupled Plasma) RIE equipment.

First, as shown in FIG. 6(a), the natural oxide film formed on the surface of the silicon substrate at the portion to be subjected to the silicon trench etching and the silicon nitride oxide film 107b were dry-etched. Specifically, the dry-etching was carried out under a plasma condition in which the pressure was set to 4 mTorr, ICP-RF power was set to 600 W, the bias RF power was set to 40 W and the gas flow rate was set to $CF_4=45$ sccm. Subsequently, as shown in FIG. 6(b), the silicon substrate 101 was dry-etched so that the intersecting angle $\theta_3$ between each side surface of the trench and the flat surface of the substrate was equal to 70° and the silicon trench depth D was equal to 100 nm. Specifically, the dry etching was carried out under a mixture gas plasma condition in which the pressure was set to 60 mTorr, the top RF power for generating plasma was set to 750 W, the bottom RF power for drawing ions was set to 90 W and the gas flow rate was set to $HBr:O_2=100:2$ sccm. In this case, the polysilicon film 107a is etched at the same time, and thus no polysilicon film 104b remains after the dry etching is finished. Furthermore, the silicon nitride film 103 is not etched in the dry etching step. Therefore, it functions as an etching mask, and also keeps the film thickness before the dry etching is carried out.

As described above, as a result of Example 2, the silicon nitride film 103 could be vertically grooved so that the trench was formed to be narrower than the pattern interval of the photoresist film 105 and have a high-precision width dimension, and the silicon nitride film 103 could be processed in connection with the shallow trench isolation width smaller than the limiting resolution width of the photolithography technique. Furthermore, the film thickness of the silicon nitride film can be controlled with high precision when trench etching is carried out to form shallow isolation.

What is claimed is:

1. A method for manufacturing a semiconductor device comprising:

a first step of successively forming a silicon oxide film and a silicon nitride film on a silicon substrate, so that the silicon nitride film is formed over the silicon oxide film on the silicon substrate, followed by forming a silicon nitride oxide film or a multilayered film containing the silicon nitride oxide film on the silicon nitride film;

a second step of forming a photoresist film having an opening portion located at the position corresponding to an element isolation area of the silicon substrate on the silicon nitride film or the multilayered film according to a photolithography method;

a third step of forming a trench having a pair of tapered side surface portions on the confronting side surfaces of the silicon nitride oxide film using the photoresist film as a mask, the tapered side surface portions of the silicon nitride oxide film being inclined toward the substrate side so as to approach each other so that a distance between the confronting side surfaces of the silicon nitride oxide film is less than a distance between confronting side surfaces of the photoresist at the opening defined therein; and a fourth step of patterning the silicon nitride film and the silicon oxide film by dry etching by using the photoresist film and the silicon nitride oxide film or the multilayered film as a mask.

2. The method for manufacturing the semiconductor device manufacturing method according to claim 1, wherein the multilayered film consists of a polysilicon film serving as a lower layer at the silicon substrate side and a silicon nitride oxide film serving as an upper layer.

3. The method for manufacturing the semiconductor device according to claim 1, wherein in the fourth step the silicon nitride film and the silicon oxide film are dry-etched substantially vertically to the flat surface of the substrate.

4. The method for manufacturing the semiconductor device according to claim 1, wherein in the third step $CF_4/CHF_3/Ar$, $CF_4/CHF_3/Ar/O_2$ or $CF_4/CHF_3/O_2$ gas is used as dry etching gas.

5. The method for manufacturing the semiconductor device according to claim 1, wherein in the fourth step $CF_4/CHF_3/Ar$ or $CF_4/CHF_3/Ar/O_2$ gas is used as dry etching gas.

6. The method for manufacturing the semiconductor device according to claim 1, further comprising a fifth step of exfoliating the photoresist film after the fourth step, and then removing a natural oxide film on the silicon substrate by dry etching by using the silicon nitride oxide film or the multilayered film and the silicon nitride film as a mask, and a sixth step of forming a trench in the silicon substrate by dry etching by using the silicon nitride oxide film or the multilayered film and the silicon nitride film as a mask.

7. The method for manufacturing the semiconductor device according to claim 6, wherein in the fifth step the dry etching is carried out to an extent that the polysilicon film of the multilayered film is exposed or the polysilicon film of a slight thickness remains.

8. The method for manufacturing the semiconductor device according to claim 6, wherein in the sixth step the polysilicon film remaining in the fifth step is dry-etched and the trench is formed in the silicon substrate while exposing the silicon nitride film.

9. The method for manufacturing the semiconductor device according to claim 6, wherein in the fifth step at least $CF_4$, $C_2F_6$ or $SF_6$ gas is used as dry etching gas.

10. The method for manufacturing the semiconductor device according to claim 6, wherein in the sixth step $HBr/O_2$ or $Cl_2/HBr/O_2$ gas is used as dry etching gas.

11. A method for manufacturing a semiconductor device comprising:

a first step of successively forming a silicon oxide film and a silicon nitride film on a silicon substrate, followed by forming a silicon nitride oxide film or a multilayered film containing the silicon nitride oxide film on the silicon nitride film;

a second step of forming a photoresist film having an opening portion located at the position corresponding to an element isolation area of the silicon substrate on the silicon nitride film or the multilayered film according to a photolithography method;

a third step of forming a trench having a pair of tapered side surface portions on the confronting side surfaces thereof on the silicon nitride oxide film or the multilayered film by using the photoresist film as a mask, the tapered side surface portions being inclined toward the substrate side so as to approach each other;

a fourth step of patterning the silicon nitride film and the silicon oxide film by dry etching by using the photoresist film and the silicon nitride oxide film or the multilayered film as a mask; and wherein in the second step the width of the opening portion of the resist mask is set to a limiting resolution width of a photolithography method.

12. The method for manufacturing the semiconductor device according to claim 1, wherein in the third step an intersecting angle of the tapered side surface portions of the trench to the flat surface of the substrate and/or the trench depth of the portion corresponding to the tapered side surface portions is adjusted by dry etching to set the width of the bottom portion of the trench.

13. The method for manufacturing the semiconductor device according to claim 1, wherein in the third step the pair of tapered side surfaces are formed in the silicon nitride oxide film or the multilayered film until reaching the silicon nitride film, thereby forming the trench.

14. A method for manufacturing a semiconductor device comprising:

a first step of successively forming a silicon oxide film and a silicon nitride film on a silicon substrate, followed by forming a silicon nitride oxide film or a multilayered film containing the silicon nitride oxide film on the silicon nitride film;

a second step of forming a photoresist film having an opening portion located at the position corresponding to an element isolation area of the silicon substrate on the silicon nitride film or the multilayered film according to a photolithography method;

a third step of forming a trench having a pair of tapered side surface portions on the confronting side surfaces thereof on the silicon nitride oxide film or the multilayered film by using the photoresist film as a mask, the tapered side surface portions being inclined toward the substrate side so as to approach each other;

a fourth step of patterning the silicon nitride film and the silicon oxide film by dry etching by using the photoresist film and the silicon nitride oxide film or the multilayered film as a mask; and wherein in the third step the pair of tapered side surface portions are formed at a first angle with respect to the flat surface of the substrate until a substantially upper half portion of the trench depth, and then a lower side surface portions are formed from the respective lower ends of the pair of tapered side surface portions at a second angle with respect to the flat surface of the substrate until reaching the silicon nitride film.

15. The method for manufacturing the semiconductor device according to claim 14, wherein the first angle $\theta_1$ of the tapered side surface portions with respect to the flat surface of the substrate is set to satisfy $70° \leq \theta_1 < 90°$.

16. The method for manufacturing the semiconductor device according to claim 14, wherein the second angle $\theta_2$ of the lower side surface portions with respect to the flat surface of the substrate is set to satisfy $\theta_1 \leq \theta_2 \leq 90°$.

17. A method for manufacturing a semiconductor device comprising:
- a first step of successively forming a silicon oxide film and a silicon nitride film on a silicon substrate, followed by forming a silicon nitride oxide film or a multilayered film containing the silicon nitride oxide film on the silicon nitride film;
- a second step of forming a photoresist film having an opening portion located at the position corresponding to an element isolation area of the silicon substrate on the silicon nitride film or the multilayered film according to a photolithography method;
- a third step of forming a trench having a pair of tapered side surface portions on the confronting side surfaces thereof on the silicon nitride oxide film or the multilayered film by using the photoresist film as a mask, the tapered side surface portions being inclined toward the substrate side so as to approach each other;
- a fourth step of patterning the silicon nitride film and the silicon oxide film by dry etching by using the photoresist film and the silicon nitride oxide film or the multilayered film as a mask;
- a fifth step of exfoliating the photoresist film after the fourth step, and then removing a natural oxide film on the silicon substrate by dry etching by using the silicon nitride oxide film or the multilayered film and the silicon nitride film as a mask, and a sixth step of forming a trench in the silicon substrate by dry etching by using the silicon nitride oxide film or the multilayered film and the silicon nitride film as a mask; and
- wherein in the sixth step the dry etching is carried out under a condition that film reduction of the silicon nitride film is prevented.

* * * * *